(12) United States Patent
Won et al.

(10) Patent No.: US 12,716,027 B2
(45) Date of Patent: Aug. 25, 2026

(54) SEMICONDUCTOR NANOPARTICLE-INCLUDING SILVER, INDIUM, GALIUM, AND SULFUR, COLOR CONVERSION PANEL INCLUDING THE SAME, AND ELECTRONIC DEVICE INCLUDING THE SAME

(71) Applicant: Samsung Electronics Co., Ltd., Suwon-si (KR)

(72) Inventors: Nayoun Won, Suwon-si (KR); Tae-Gon Kim, Suwon-si (KR); Minho Kim, Suwon-si (KR); Seungrim Yang, Suwon-si (KR); Shin Ae Jun, Suwon-si (KR); Yebin Jung, Suwon-si (KR); A Ra Jo, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 578 days.

(21) Appl. No.: 18/185,755

(22) Filed: Mar. 17, 2023

(65) Prior Publication Data

US 2023/0295492 A1 Sep. 21, 2023

(30) Foreign Application Priority Data

Mar. 18, 2022 (KR) ........................ 10-2022-0034342

(51) Int. Cl.

*C09K 11/62* (2006.01)
*C09K 11/02* (2006.01)

(Continued)

(52) U.S. Cl.

CPC ............ *C09K 11/623* (2013.01); *C09K 11/02* (2013.01); *H10H 20/8512* (2025.01); *H10K 59/38* (2023.02)

(58) Field of Classification Search

CPC ..... C09K 11/623; C09K 11/02; C09K 11/621; C09K 11/025; C09K 11/641;

(Continued)

(56) References Cited

U.S. PATENT DOCUMENTS 10,927,294 B2 2/2021 Mamuye et al.
11,101,413 B2 8/2021 Torimoto et al.

(Continued)

FOREIGN PATENT DOCUMENTS

CN 113275022 A 8/2021
JP 2019085575 A 6/2019

(Continued)

OTHER PUBLICATIONS

Office Action dated Aug. 30, 2024, of the corresponding Korean Patent Application No. 10-2023-0035485.

(Continued)

*Primary Examiner* — Norman D Richards
*Assistant Examiner* — Ethan Edward Cutler
(74) *Attorney, Agent, or Firm* — CANTOR COLBURN LLP

(57) ABSTRACT

A semiconductor nanoparticle, including silver, a Group 13 metal, and a chalcogen element, wherein the semiconductor nanoparticle emits a first light, the Group 13 metal includes gallium, and optionally further includes indium, aluminum, or a combination thereof, the chalcogen element includes sulfur, and optionally further includes selenium, the first light has a full width at half maximum of greater than or equal to about 5 nanometers (nm) to less than or equal to about 70 nm, the first light has a maximum emission wavelength of greater than or equal to about 500 nm to less than or equal to about 600 nm, the semiconductor nanoparticle has a quantum yield of greater than or equal to about 50%, a mole ratio of gallium to sulfur is greater than or equal (Continued)

to about 0.1:1 to less than or equal to about 1:1, and a charge balance value defined by Equation 1 herein.

20 Claims, 13 Drawing Sheets

(51) Int. Cl.
*H10H 20/851* (2025.01)
*H10K 59/38* (2023.01)

(58) Field of Classification Search
CPC ..... C09K 11/881; C09K 11/562; C09K 11/58; H10H 20/8512; H10H 20/8513; H10K 59/38; B82Y 20/00; B82Y 30/00; C09D 11/00; C09D 11/03; G02B 5/20; G02F 1/133514; G02F 2203/055
See application file for complete search history.

(56) References Cited

U.S. PATENT DOCUMENTS

| | | | |
|---|---|---|---|
| 11,957,020 B2 | 4/2024 | Ichihashi et al. | |
| 2009/0278094 A1 | 11/2009 | Torimoto et al. | |
| 2017/0267924 A1 | 9/2017 | Kuwabata et al. | |
| 2019/0211261 A1* | 7/2019 | Jang | H10K 59/35 |
| 2020/0006601 A1* | 1/2020 | Torimoto | C09K 11/62 |
| 2020/0024713 A1 | 1/2020 | Das et al. | |
| 2020/0172806 A1* | 6/2020 | Park | C09K 11/565 |
| 2020/0399535 A1 | 12/2020 | Mamuye et al. | |
| 2021/0284908 A1 | 9/2021 | Kim et al. | |
| 2021/0363422 A1 | 11/2021 | Nikata et al. | |
| 2022/0228057 A1 | 7/2022 | Mamuye et al. | |
| 2023/0102912 A1 | 3/2023 | Wu | |
| 2023/0151271 A1 | 5/2023 | Torimoto et al. | |
| 2023/0165026 A1 | 5/2023 | Torimoto et al. | |

FOREIGN PATENT DOCUMENTS

| | | | |
|---|---|---|---|
| KR | 101734464 B1 | 5/2017 | |
| KR | 101904968 B1 | 10/2018 | |
| KR | 2047116 B1 | 11/2019 | |
| KR | 102047116 A | 11/2019 | |
| KR | 20200109307 A | 9/2020 | |
| KR | 20200120532 A | 10/2020 | |
| KR | 20210007738 A | 1/2021 | |
| KR | 20210027276 A | 3/2021 | |
| KR | 20210036978 A | 4/2021 | |
| KR | 20210115612 A | 9/2021 | |
| WO | 2013162334 A1 | 10/2013 | |
| WO | WO-2021182417 A1 * | 9/2021 | C09K 11/621 |

OTHER PUBLICATIONS

Extended European Search Report dated Jul. 20, 2023, of the corresponding European Patent Application No. 23162742.3.

Extended European Search Report dated Jul. 20, 2023, of the corresponding European Patent Application No. 23162733.2.

Cheng Ruan, et al., White Light-Emitting Diodes Based on AgInS2/ZnS Quantum Dots with Improved Bandwidth in Visible Light Communication, Nanomaterials, 2016, 6, 13; doi: 10.3390/nano6010013, 8 pp.

Irshad Ahmad Mir, et al., Bandgap tunable AgInS based quantum dots for high contrast cell imaging with enhanced photodynamic and antifungal applications, 2018, Scientific Reports, 8(1), pp. 1-12.

Taro Uematsu, et al., Narrow band-edge photoluminescencefrom AgInS2 semiconductor nanoparticlesby the formation of amorphous III-VIsemiconductor shells, NPG Asia Materials (2018) 10: 713-726.

Tatsuya Kameyama, et al., Wavelength-Tunable Band-Edge Photoluminescence of Nonstoichiometric Ag—In—S Nanoparticles via Ga 3+ Doping, ACS Applied Materials & Interfaces, 2018, 10(49), pp. 42844-42855.

Watcharaporn Hoisang, et al., Core Nanoparticle Engineering for Narrower andMore Intense Band-Edge Emission from AgInS2/GaSxCore/Shell Quantum Dots, Nanomaterials 2019, 9, 1763, 16 pp.

* cited by examiner

Pattern Preparation by using a photoresist

Repeating three times of patterning process for each pixel 240
31
11
21
160
170
130
100
90c
90b
90a
140c
150b
140b
150a
140a
PX3
PX2
PX1
OLED
B
R
G
x
y
z 200
240
241
230
300
231
221
220
221
211
210
300
120
310
311
110
B
G
R

SEMICONDUCTOR NANOPARTICLE-INCLUDING SILVER, INDIUM, GALIUM, AND SULFUR, COLOR CONVERSION PANEL INCLUDING THE SAME, AND ELECTRONIC DEVICE INCLUDING THE SAME

CROSS-REFERENCE TO RELATED APPLICATION

This application claims priority to and the benefit of Korean Patent Application No. 10-2022-0034342 filed in the Korean Intellectual Property Office on Mar. 18, 2022, and all the benefits accruing therefrom under 35 U.S.C. § 119, the entire content of which is incorporated herein by reference.

BACKGROUND

1. Field

A semiconductor nanoparticle, a method of producing the same, a color conversion panel including the semiconductor nanoparticle, and an electronic device including the same are provided.

2. Description of the Related Art

A semiconductor nanoparticle may show, e.g., exhibit, different aspects, than a corresponding bulk material having substantially the same composition, for example, in terms of some physical properties (e.g., a bandgap energy, a luminescent property, or the like) that are intrinsic in case of the bulk material. The semiconductor nanoparticle may be configured to emit light upon excitation by an energy such as an incident light or an applied voltage. Such a luminescent nanostructure may find applicability in a variety of devices (e.g., a display panel or an electronic device including the display panel).

SUMMARY

An aspect relates to a semiconductor nanoparticle capable of emitting light and exhibiting an improved optical property (e.g., a relatively high excitation light absorbance and/or a narrow full width at half maximum) and/or an improved stability (for example, process stability and/or chemical stability).

An aspect relates to a device (such as a color conversion panel) including the semiconductor nanoparticle.

An aspect relates to a method of producing the semiconductor nanoparticle.

An aspect relates to a composition (e.g., an ink composition) including the semiconductor nanoparticle.

An aspect relates to an electronic device (e.g., a display device) including the semiconductor nanoparticle or the device (e.g., the color conversion panel) of the aspect.

An aspect relates to a population of the semiconductor nanoparticle.

In an aspect, the semiconductor nanoparticle includes silver, a Group 13 metal, and a chalcogen element, wherein the semiconductor nanoparticle emits a first light, wherein the Group 13 metal includes gallium; and optionally further includes indium, aluminum, or a combination thereof, wherein the chalcogen element includes sulfur, and optionally further includes selenium, wherein the first light has a full width at half maximum of greater than or equal to about 5 nanometers (nm) to less than or equal to about 70 nm, wherein the semiconductor nanoparticle has a quantum yield (e.g., an absolute quantum yield) of greater than or equal to about 50%, wherein a mole ratio of gallium to sulfur is greater than or equal to about 0.1:1 to less than or equal to about 1:1, and wherein a charge balance value as defined by Equation 1 is greater than or equal to about 0.8 to less than or equal to about 1.5:

$$\text{charge balance value}=\{[Ag]+3\times([\text{Group 13 metal}])\}/(2\times[CHA]) \quad \text{Equation 1}$$

wherein, in Equation 1,

[Ag], [Group 13 metal], and [CHA] are molar amounts of the silver, the Group 13 metal, and the chalcogen element in the semiconductor nanoparticle, respectively.

The charge balance value may be greater than or equal to about 1, greater than or equal to about 1.02, greater than or equal to about 1.05, greater than or equal to about 1.17, greater than or equal to about 1.18, or greater than or equal to about 1.19.

The charge balance value may be less than or equal to about 1.45, or less than or equal to about 1.3.

The Group 13 metal may include indium and gallium. In the semiconductor nanoparticle, a mole ratio of gallium to a sum of indium and gallium [Ga:(In+Ga)] may be greater than or equal to about 0.8:1. The mole ratio of gallium to a sum of indium and gallium [Ga:(In+Ga)] may be less than or equal to about 0.96:1.

In the semiconductor nanoparticle, the Group 13 metal may further include aluminum.

The semiconductor nanoparticle may include copper or may not include copper.

In the semiconductor nanoparticle, the chalcogen element includes sulfur.

The first light may have a maximum emission wavelength of greater than or equal to about 500 nm to less than or equal to about 600 nm. The first light may be a green light.

The maximum emission wavelength of the first light or the green light may be greater than or equal to about 505 nm to less than or equal to about 580 nm.

The semiconductor nanoparticle may exhibit a quantum yield (e.g., an absolute quantum yield, hereinafter, "quantum yield") of greater than or equal to about 60%.

The quantum yield may be greater than or equal to about 62%, greater than or equal to about 65%, or greater than or equal to about 70%.

The quantum yield may be about 80% to about 100%.

The full width at half maximum (FWHM) may be less than or equal to about 45 nm, less than or equal to about 40 nm, or less than or equal to about nm.

The full width at half maximum may be greater than or equal to about 5 nm, greater than or equal to about 10 nm, greater than or equal to about 15 nm, or greater than or equal to about 25 nm.

The first light may include a band-edge emission.

At least about 90%, at least about 95%, or at least about 97% of emission of the semiconductor nanoparticle may be band-edge emission.

In a photoluminescence spectrum of the semiconductor nanoparticle, a relative band-edge emission intensity defined by Equation 2 may be greater than about 20:

$$\text{relative band-edge emission intensity}=A1/A2 \quad \text{Equation 2}$$

wherein, in Equation 2,

A1 is an intensity at a maximum emission wavelength, and

A2 is a maximum intensity in a tail wavelength range of the maximum emission wavelength+greater than or equal to about 80 nm.

In the semiconductor nanoparticle, a mole ratio of sulfur to a sum of silver, indium, and gallium [S:(Ag+In+Ga)] may be greater than or equal to about 0.65:1, greater than or equal to about 0.68:1, or greater than or equal to about 1:1.

In the semiconductor nanoparticle, the mole ratio of sulfur to a sum of silver, indium, and gallium [S:(Ag+In+Ga)] may be less than or equal to about 2.5:1, less than or equal to about 1.5:1, less than or equal to about 1.35:1, or less than or equal to about 1.15:1.

In the semiconductor nanoparticle, a mole ratio of a sum of indium and gallium to silver [(In+Ga):Ag] may be greater than or equal to about 1.7:1, or greater than or equal to about 1.8:1 to less than or equal to about 3.5:1.

In the semiconductor nanoparticle, a mole ratio of gallium to sulfur (Ga:S) may be greater than or equal to about 0.46:1, greater than or equal to about 0.47:1, greater than or equal to about 0.5:1, or greater than or equal to about 0.55:1.

The mole ratio of gallium to sulfur (Ga:S) may less than about 1:1, less than or equal to about 0.98:1, less than or equal to about 0.92:1, or less than or equal to about 0.9:1.

In the semiconductor nanoparticle, a mole ratio of a sum of indium and gallium to sulfur [(In+Ga):S] may be greater than or equal to about 0.66:1, greater than or equal to about 0.68:1, or greater than or equal to about 0.73:1. The mole ratio of the sum of indium and gallium to sulfur [(In+Ga):S] may be less than about 1.16:1, less than or equal to about 1:1, or less than or equal to about 0.73:1.

In the semiconductor nanoparticle, a mole ratio of silver to sulfur [Ag:S] may be greater than or equal to about 0.3:1, or greater than or equal to about 0.32:1. The mole ratio of silver to sulfur (Ag:S) may be less than or equal to about 0.4:1, or less than or equal to about 0.39:1.

In the semiconductor nanoparticle, a mole ratio of silver to a sum of silver, indium, and gallium [Ag:(Ag+In+Ga)] may be greater than or equal to about 0.31:1, greater than or equal to about 0.32:1, or greater than or equal to about 0.33:1. In the semiconductor nanoparticle, the mole ratio of silver to a sum of silver, indium, and gallium [Ag:(Ag+In+Ga)] may be less than or equal to about 0.4:1, or less than or equal to about 0.35:1.

In one or more embodiments, the semiconductor nanoparticle may not include lithium.

In one or more embodiments, the semiconductor nanoparticle may not include sodium.

In one or more embodiments, the semiconductor nanoparticle may not include an alkali metal.

An indium amount (or concentration) in a portion adjacent to a surface (e.g., a second semiconductor nanocrystal) of the semiconductor nanoparticle may be less than an indium amount (or concentration) in a central portion (inner portion or a first semiconductor nanocrystal) thereof. The semiconductor nanoparticle may further include an inorganic layer including a zinc chalcogenide on a surface thereof (for example, as an outermost layer).

The thickness of the inorganic layer may be greater than or equal to about 0.1 nm, greater than or equal to about 0.5 nm, or greater than or equal to about 0.7 nm. The thickness of the inorganic layer may be less than or equal to about 5 nm, less than or equal to about 1.5 nm, less than or equal to about 1 nm, or less than or equal to about 0.8 nm.

The semiconductor nanoparticle may include a first semiconductor nanocrystal and optionally a second semiconductor nanocrystal. In the semiconductor nanoparticle, the second semiconductor nanocrystal may be disposed on the first semiconductor nanocrystal or surround at least a portion of the first semiconductor nanocrystal.

In the semiconductor nanoparticle, the second semiconductor nanocrystal may be disposed between the first semiconductor nanocrystal and the outermost layer (or the inorganic layer).

A thickness of the outermost layer may be greater than or equal to about 0.01 times to less than or equal to about 0.9 times, or 0.5 times of a radius of the semiconductor nanoparticle.

The first semiconductor nanocrystal may include silver, a Group 13 element, and a chalcogen element. The Group 13 element may include indium, and optionally may further include gallium. The chalcogen element may include sulfur, and optionally may further include or may not include selenium. The first semiconductor nanocrystal may not include zinc.

The second semiconductor nanocrystal may include gallium and sulfur, and optionally may further include silver. The second semiconductor nanocrystal may have a different composition from the first semiconductor nanocrystal.

In one or more embodiments, a method of producing the semiconductor nanoparticle may include obtaining the first semiconductor nanocrystal including silver, a Group 13 metal, and a chalcogen element;

preparing a reaction medium including a first precursor, an organic ligand, and an organic solvent;

heating the reaction medium to a first temperature;

adding the first semiconductor nanocrystal and a second precursor to the heated reaction medium, wherein one of the first precursor and the second precursor is a gallium precursor and the other is a sulfur precursor; and heating the reaction medium to a second temperature and reacting for a first reaction time to form the semiconductor nanoparticle (for example, including the first semiconductor nanocrystal and the second semiconductor nanocrystal), wherein the first temperature is greater than or equal to about 120° C. to less than or equal to about 280° C., and the second temperature is greater than or equal to about 190° C. and less than or equal to about 380° C.

In one or more embodiments, the first reaction time may be controlled to obtain the charge balance value as described herein.

The first temperature and the second temperature may be different. The second temperature may be greater than the first temperature.

The gallium precursor may include a gallium halide and optionally gallium acetylacetonate. The organic solvent may include an aliphatic amine. The organic ligand may include a thiol compound.

The second temperature may be greater than or equal to about 290° C. to less than or equal to about 330° C. The first reaction time may be greater than or equal to about 10 minutes to less than about 50 minutes.

The second temperature may be less than about 290° C. (e.g., greater than or equal to about 200° C. to less than or equal to about 250° C.) and the first reaction time may be greater than or equal to about 30 minutes (and, for example, less than or equal to about 90 minutes, or less than or equal to about 70 minutes, or less than or equal to about 60 minutes).

In one or more embodiments, a composite includes a matrix and the semiconductor nanoparticle dispersed in the matrix.

The composite may be a patterned film.

The composite may be a sheet in which the semiconductor nanoparticle that emits the first light and a semiconductor nanoparticle that emits a second light different from the first light are mixed.

An amount of the semiconductor nanoparticle in the composite may be about 1 weight percent (wt %) to about 50 wt %, about 10 wt % to about 30 wt %, or about 15 wt % to about 20 wt %, based on a total weight of the composite.

An incident light (e.g., blue) light absorbance of the composite may be greater than or equal to about 70%, greater than or equal to about 80%, greater than or equal to about 85%, or greater than or equal to about 90%. The incident light absorbance of the composite may be about 70% to about 100%, about 80% to about 98%, about 95% to about 99%, or about 96% to about 98%.

A light conversion efficiency (CE) of the composite may be greater than or equal to about 6%, greater than or equal to about 7%, greater than or equal to about 8%, greater than or equal to about 9%, greater than or equal to about 10%, greater than or equal to about 11%, greater than or equal to about 12%, greater than or equal to about 12.5%, greater than or equal to about 12.9%, greater than or equal to about 13%, greater than or equal to about 14.5%, greater than or equal to about 15%, greater than or equal to about 15.5%, greater than or equal to about 16%, greater than or equal to about 16.5%, greater than or equal to about 16.7%, or greater than or equal to about 16.9%.

In one or more embodiments, a device includes a color conversion layer (for example, a color conversion structure) including a color conversion region including the semiconductor nanoparticle.

In one or more embodiments, a color conversion panel includes a color conversion layer (for example, a color conversion structure) including a color conversion region and optionally a partition wall defining each region of the color conversion layer. The color conversion region includes a first region corresponding to a first pixel, the first region includes a first composite, and the first composite includes a matrix and a semiconductor nanoparticle dispersed in the matrix.

The (polymer) matrix may include a linear polymer, a crosslinked polymer, or a combination thereof.

The crosslinked polymer may include a thiol-ene polymer, a crosslinked poly(meth)acrylate, a crosslinked polyurethane, a crosslinked epoxy resin, a crosslinked vinyl polymer, a crosslinked silicone resin, or the like, or a combination thereof. The thiol-ene polymer may include a polymerization product of a monomer combination including a (polyfunctional or monofunctional) thiol compound having at least one thiol group at the terminal end and an ene compound having a carbon-carbon unsaturated bond.

The linear polymer may include a repeating unit derived from a carbon-carbon unsaturated bond (e.g., a carbon-carbon double bond). The repeating unit may include a carboxylic acid group. The linear polymer may include an ethylene repeating unit.

The carboxylic acid group-containing repeating unit of the linear polymer may include a unit derived from a monomer including a carboxylic acid group and a carbon-carbon double bond, a unit derived from a monomer having a dianhydride moiety, or a combination thereof.

The first composite may further include metal oxide fine particles.

The first composite may be in a form of a patterned film.

An embodiment is a population of the semiconductor nanoparticle described herein.

In one or more embodiments, an ink composition includes a liquid vehicle and the semiconductor nanoparticle (or a population thereof) as described herein. The ink composition may be substantially free of a volatile organic solvent.

The semiconductor nanoparticle (or a plurality thereof) may be dispersed within the liquid vehicle.

The liquid vehicle may include a liquid monomer, an organic solvent, or a combination thereof.

The ink composition may further include a metal oxide fine particle.

In one or more embodiments, a display panel or a display device includes a light source and the color conversion layer (e.g., the color conversion structure) as described herein.

In one or more embodiments, a display panel may include a light emitting panel (or a light source) and the color conversion panel, and optionally a light transmitting layer located between the light emitting panel and the color conversion panel.

The light emitting panel (or light source) may be configured to provide (or provides) an incident light to the color conversion panel. The incident light may include a blue light, and, optionally, a green light. The blue light may have a maximum emission wavelength of about 440 nm to about 460 nm, or about 450 nm to about 455 nm.

The light source may include an organic light emitting diode (OLED), a micro LED, a mini LED, an LED including a nanorod, or a combination thereof.

In one or more embodiments, the electronic device (or display device) includes the color conversion panel or the display panel.

The semiconductor nanoparticles according to an aspect may exhibit improved properties (e.g., an improved blue light absorbance, a relatively narrow full width at half maximum, a relatively high luminous efficiency, and/or a process stability) and/or may be more cost effective. The color conversion panel of an aspect may utilize various light sources, and may be usefully utilized in a liquid crystal display device, a QD OLED display device, and/or a QD micro LED display device in which a QD color conversion layer or pixel is applied to a blue LED, blue-OLED, and/or a blue micro LED, respectively. The semiconductor nanoparticle and the color conversion panel may be applied to various devices such as TVs, monitors, mobile devices, VR/AR, automotive displays, or the like, but embodiments are not limited thereto.

BRIEF DESCRIPTION OF THE DRAWINGS

The above and other advantages and features of this disclosure will become more apparent by describing in further detail exemplary embodiments thereof with reference to the accompanying drawings.

DETAILED DESCRIPTION

Figure 1A:
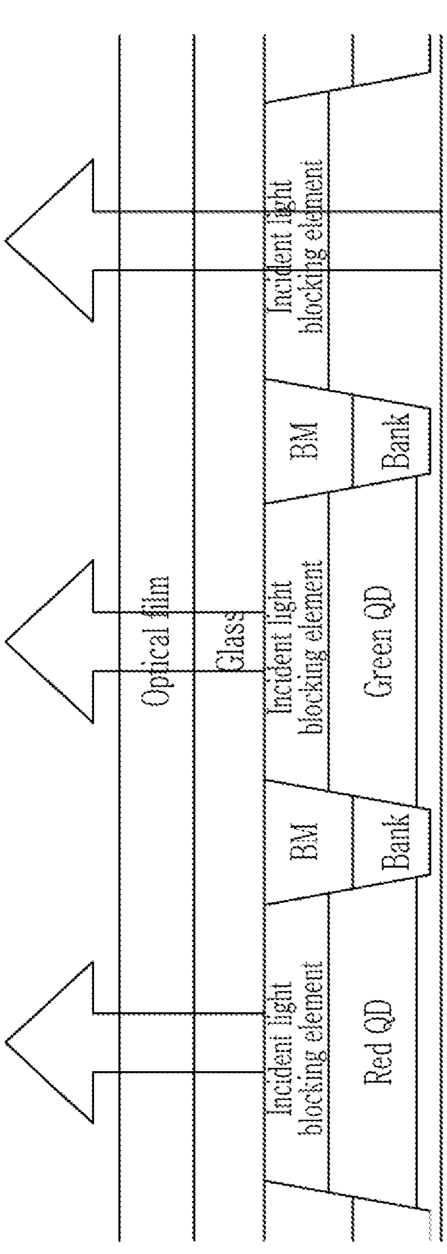
FIG. 1A is a schematic cross-sectional view of a color conversion panel of one or more embodiments.

Advantages and features of the techniques described hereinafter, and methods of achieving them, will become apparent with reference to the exemplary embodiments described in further detail below and in conjunction with the accompanying drawings. However, the exemplary embodiments should not be construed as being limited to the exemplary embodiments set forth herein. If not defined otherwise, all terms (including technical and scientific terms) in the specification may be defined as commonly understood by one skilled in the art. The terms defined in a generally used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the singular forms "a," "an," and "the" are intended to include the plural forms, including "at least one," unless the context clearly indicates otherwise. For example, the wording "semiconductor nanoparticle" may refer to a single semiconductor nanoparticle or may refer to a plurality of semiconductor nanoparticles. "At least one" is not to be construed as being limited to "a" or "an." "Or" means "and/or." As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments.

As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In one or more embodiments, substantially no amount of cadmium (or other harmful heavy metal) may be present or, if present, an amount of cadmium (or other harmful heavy metal) may be less than or equal to a detection limit or as an impurity level of a given analysis tool.

As used herein, if a definition is not otherwise provided, "substituted" refers to replacement of at least one hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C7 to C30 arylalkyl group, a C6 to C30 aryloxy group, a C6 to C30 arylthio group, a C1 to C30 alkoxy group, a C1 to C30 alkylthio group, a C1 to C30 heteroalkyl group, a C3 to C30 heteroalkylaryl group, a C2 to C30 alkylheteroaryl group, a C2 to C30 heteroarylalkyl group, a C1 to C30 heteroaryloxy group, a C1 to C30 heteroarylthio group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group ($—NO_2$), a cyano group (—CN), an amino group or an amine group (—NRR' wherein R and R' are each independently hydrogen or a C1 to C6 alkyl group), an azido group ($—N_3$), an amidino group ($—C(=NH)NH_2$), a hydrazino group ($—NHNH_2$), a hydrazono group (=N $(NH_2)$), an aldehyde group (—C(═O)H), a carbamoyl group (—C(O)$NH_2$), a thiol group (—SH), an ester group (—C(═O)OR, wherein R is a C1 to C6 alkyl group or a C6 to C12 aryl group), a carboxyl group (—COOH) or a salt thereof (—C(═O)OM, wherein M is an organic or inorganic cation, a sulfonic acid group (—$SO_3H$) or a salt thereof (—$SO_3M$, wherein M is an organic or inorganic cation), a phosphoric acid group (—$PO_3H_2$) or a salt thereof (—$PO_3MH$ or —$PO_3M_2$, wherein M is an organic or inorganic cation), or a combination thereof.

In addition, if a definition is not otherwise provided, "hetero" means the case where 1 to 3 heteroatoms selected from N, O, P, Si, S, Se, Ge, and B is or are included.

In addition, the term "aliphatic hydrocarbon group" as used herein refers to a C1 to C30 linear or branched alkyl group, a C1 to C30 linear or branched alkenyl group, or a C1 to C30 linear or branched alkynyl group, and the term "aromatic organic group" as used herein refers to a C6 to C30 aryl group or a C2 to C30 heteroaryl group.

As used herein, the term "(meth)acrylate" refers to acrylate and/or methacrylate.

As used herein, the term "Group" refers to a Group of the Periodic Table of Elements.

As used herein, a nanoparticle refers to a structure having at least one region or characteristic dimension with a nanoscale dimension. In one or more embodiments, the dimension of the nanoparticle or the nanostructure may be less than about 500 nm, less than about 300 nm, less than about 250 nm, less than about 150 nm, less than about 100 nm, less than about 50 nm, or less than about 30 nm. The nanoparticle or nanostructure may have any shape, such as a nanowire, a nanorod, a nanotube, a multi-pod type shape having two or more pods, or a nanodot, but embodiments are not limited thereto. The nanoparticle or nanostructure may be, for example, substantially crystalline, substantially monocrystalline, polycrystalline, amorphous, or a combination thereof.

A quantum dot may be, e.g., a semiconductor-containing nanocrystal particle that can exhibit a quantum confinement effect or an exciton confinement effect, and is a type of a luminescent nanostructure (e.g., capable of emitting light by energy excitation). Herein, a shape of the "quantum dot" or the nanoparticle is not limited unless otherwise defined.

As used herein, the term "dispersion" refers to a dispersion in which a dispersed phase is a solid, and a continuous medium includes a liquid or a solid different from the dispersed phase. Herein, the "dispersion" may be a colloidal dispersion in which the dispersed phase has a dimension of greater than or equal to about 1 nm, for example, greater than or equal to about 2 nm, greater than or equal to about 3 nm, or greater than or equal to about 4 nm to several micrometers (μm) or less, (e.g., less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm).

As used herein, a dimension (a size, a diameter, a thickness, or the like) may be a value for a single entity or an average value for a plurality of particles. As used herein, the term "average" (e.g., an average size of the quantum dot) may be a mean value or a median value. In one or more embodiments, the average may be a "mean" average.

As used herein, the term "maximum emission wavelength" is the wavelength at which a given emission spectrum of the light reaches its maximum.

In one or more embodiments, a quantum efficiency may be readily and reproducibly determined using commercially available equipment (e.g., from Hitachi or Hamamatsu, etc.) and referring to manuals provided by, for example, respective equipment manufacturers. The quantum efficiency (which can be interchangeably used with the term "quantum yield" (QY)) may be measured in a solution state or a solid state (in a composite). In one or more embodiments, the quantum efficiency (or the quantum yield) is the ratio of photons emitted to photons absorbed by the nanostructure (or population thereof). In one or more embodiments, the quantum efficiency may be measured by any suitable method. For example, there may be two methods for measuring the fluorescence quantum yield or efficiency: the absolute method and the relative method. The quantum efficiency measured by the absolute method may be referred to as an absolute quantum efficiency.

In the absolute method, the quantum efficiency may be obtained by detecting the fluorescence of all samples through an integrating sphere. In the relative method, the quantum efficiency of the unknown sample may be calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but embodiments are not limited thereto.

A full width at half maximum and a maximum emission wavelength may be measured, for example, from a luminescence spectrum (for example, a photoluminescence (PL) spectrum or an electroluminescent (EL) spectrum) obtained by a spectrophotometer such as a fluorescence spectrophotometer or the like.

As used herein, the term "first absorption peak wavelength" refers to a wavelength at which a main peak first appears in a lowest energy region in the UV-Vis absorption spectrum. A nanoparticle may be included in a variety of electronic devices. An electrical and/or an optical property of the nanoparticle may be controlled for example, by its elemental composition, its size, its shape, or a combination thereof. In one or more embodiments, the semiconductor nanoparticle may include a semiconductor nanocrystal. The semiconductor nanoparticle such as a quantum dots may have a relatively large surface area per a unit volume, and thus, may exhibit a quantum confinement effect, exhibiting physical properties and optical properties that are different from a corresponding bulk material having the same composition. Therefore, a luminescent nanoparticle such as a quantum dot may absorb energy (e.g., incident light) supplied from an excitation source to form an excited state, which upon relaxation is capable of emitting an energy corresponding to its bandgap energy.

The semiconductor nanoparticle may be also used in a color conversion panel (e.g., a photoluminescent color filter or the like). Instead of a white light-emitting back light unit used in a liquid crystal display device, a display device including a quantum dot-containing color conversion panel or a luminescent-type color filter may use a quantum dot layer as a luminescent material and includes the same in a relatively front part of a device to convert an incident light (e.g., a blue light) provided from a light source to a light of a different spectrum (for example, a green light or a red light). In such a color conversion panel, the color conversion of the incident light may occur in a relatively front part of the device, and the light may be scattered in all directions, which may address a viewing angle problem of the liquid crystal display, and a light loss problem caused by using an absorption type color filter may be addressed as well.

In one or more embodiments, the "color conversion panel" is a device (e.g., an electronic device) including a color conversion layer or a color conversion structure. From an environmental point of view, it is desirable to develop a luminescent nanoparticle not containing a harmful heavy metal, such as cadmium, and showing an improved luminescent property.

In the display device including the color conversion panel, a property (e.g., an optical property, stability, or the like) of a semiconductor nanoparticle used as a light emitting material may have a direct effect on a displaying quality of the device. It may be desired for the luminescent material included in the color conversion panel disposed in a relatively front portion of the device to exhibit not only a relatively high luminous efficiency, but also a relatively high absorbance with respect to an incident light. When a patterned film (e.g., for a color filter) is used in the display device, a relatively low absorbance to the incident light may be a direct cause of a blue light leakage, having an adverse effect on color reproducibility (e.g., DCI match rate) of the device. In one or more embodiments, an adoption of an absorption-type color filter may be considered as a measure for preventing such a blue light leakage problem. However, without wishing to be bound by any theory, it is believed that a relatively low absorbance of the semiconductor nanoparticle may result in a decrease in a luminance of a device including the same.

Some semiconductor nanoparticles may show properties (e.g., optical properties and/or stability) applicable to an actual device, but many of them include a cadmium-containing compounds (e.g., cadmium chalcogenide). As cadmium is one of the most restricted elements, and possibly causes a serious environment/health issue, developing a cadmium-free environmentally friendly semiconductor nanoparticle is still desirable, and an abundance of in-depth research on Group III-V compound-containing nanocrystals has been conducted in this respect. However, it is still desirable to develop a cadmium-free semiconductor nanoparticle that can show a higher incident light absorbance and a narrower full width at half maximum besides a cadmium-free semiconductor nanoparticle including the Group III-V compound (e.g., based on an indium phosphide).

Therefore, there remains a technological need to develop an environmentally friendly semiconductor nanoparticle that can exhibit a higher absorbance, a narrower full width at half maximum, and/or a higher luminous efficiency.

In one or more embodiments, a semiconductor nanoparticle may not include cadmium. In one or more embodiments, the semiconductor nanoparticle may not include mercury, lead, or a combination thereof. It is to be understood that undesirable heavy metals include cadmium, mercury, and/or lead.

The semiconductor nanoparticle includes silver, a Group 13 metal (e.g., gallium, and optionally further includes indium, aluminum, or a combination thereof), and a chalcogen element (sulfur, and optionally further includes selenium). The semiconductor nanoparticle is configured to emit a first light. By having the structure/composition described herein, the semiconductor nanoparticle may emit light of a desired wavelength and may achieve an improved optical property (e.g., a narrow full width at half maximum, an increased quantum yield, and/or a relatively high level of a blue light absorbance). The semiconductor nanoparticle of one or more embodiments may be, for example, utilized as a down-conversion material for a color conversion panel or a color conversion sheet, and may exhibit an increased absorption per a weight of the semiconductor nanoparticle, and thus a device (e.g., a panel or a sheet) including the same may be manufactured at a reduced production cost and may provide an improved photoconversion performance. In one or more embodiments, the semiconductor nanoparticle may exhibit a reduced or suppressed emission (e.g., trap emission) in an unwanted wavelength range.

The semiconductor nanoparticle includes silver, a Group 13 metal (e.g., gallium; and optionally further includes indium, aluminum, or a combination thereof), and a chalcogen element (e.g., sulfur, and optionally further includes selenium). The semiconductor nanoparticle includes a charge balance value defined by the following Equation 1 that is greater than or equal to about 0.8 to less than or equal to about 1.5.

$$\text{charge balance value}=\{[\text{Ag}]+3\times([\text{Group 13 metal}])\}/(2\times[\text{CHA}]) \quad \text{Equation 1}$$

wherein, in Equation 1, [Ag], [Group 13 metal], and [CHA] are molar amounts of the silver, a Group 13 metal (e.g., indium, gallium, or a combination thereof), and a chalcogen element (e.g., sulfur, selenium, or a combination thereof) in the semiconductor nanoparticle, respectively.

The Group 13 metal may include indium and gallium. The chalcogen element may include sulfur.

In one or more embodiments, the charge balance value may be represented by the following Equation 1A:

$$\text{charge balance value}=\{[\text{Ag}]+3\times([\text{In}]+[\text{Ga}])\}/(2\times[\text{S}]) \quad \text{Equation 1A}$$

wherein, in Equation 1A, [Ag], [In], [Ga], and [S] are molar amounts of silver, indium, gallium, and sulfur in the semiconductor nanoparticle, respectively.

In one or more embodiments, the semiconductor nanoparticle may further include copper, and in this case, the charge balance value may be calculated by considering the contents of silver and copper together. In some embodiments, the semiconductor nanoparticle or a first semiconductor nanocrystal described herein may not include copper.

The present inventors have found that it would be difficult for the semiconductor nanoparticle including a Group 13 metal and a chalcogen element along with silver (Ag) to achieve desired luminous properties (for example, both of a narrower full width at half maximum and a higher quantum yield) simultaneously. In addition, the present inventors have found that most of the semiconductor nanoparticles including the Group 13 metal and the chalcogen element along with the silver prepared according to the prior art may provide a substantial amount of trap emission together with a band-edge emission, and thus the emission (e.g., the trap emission or a defect emission) at an unwanted wavelength, for example, a wavelength significantly shifted to a longer wavelength than the maximum emission wavelength based on band-edge emission (hereinafter referred to as a trap emission wavelength) may account for a considerable portion of the emission in the light emitted from the semiconductor nanoparticle.

Without wishing to be bound by any theory, in the semiconductor nanoparticle of one or more embodiments, the charge balance value (and in some embodiment, together with the molar ratio(s) between the components as described herein) may indicate that in the semiconductor nanoparticle, an amount of an unwanted by-products (e.g., gallium oxide) is considerably reduced or suppressed, and the first particle (or the semiconductor nanoparticle including the same) may exhibit a desired composition. The present inventors have found that, in the preparation of the semiconductor nanoparticle including the Group 13 metal and the chalcogen element together with silver (Ag), a side reaction (e.g., oxidation) of precursors may not be controlled well, and thus, even in the case where mole amounts of the individual elements in a given semiconductor nanoparticle may be controlled within a desired range with a tolerable deviation, the properties exhibited by the given semiconductor nanoparticle or a composite including the same may significantly vary depending on the charge balance value of the semiconductor nanoparticle.

In one or more embodiments, the charge balance value according to Equation 1 may be less than or equal to about 1.5, less than or equal to about 1.45, less than or equal to about 1.4, less than or equal to about 1.35, less than or equal to about 1.34, less than or equal to about 1.33, less than or equal to about 1.32, less than or equal to about 1.31, less than or equal to about 1.3, less than or equal to about 1.29, less than or equal to about 1.28, less than or equal to about 1.27, less than or equal to about 1.26, less than or equal to about 1.25, less than or equal to about 1.24, less than or equal to about 1.23, less than or equal to about 1.22, less than or equal to about 1.21, or less than or equal to about 1.2.

The charge balance value according to Equation 1 may be greater than or equal to about 0.81, greater than or equal to about 0.85, greater than or equal to about 0.9, greater than or equal to about 0.95, greater than or equal to about 0.97, greater than or equal to about 0.99, greater than or equal to about 1, greater than or equal to about 1.01, greater than or equal to about 1.02, greater than or equal to about 1.03, greater than or equal to about 1.04, greater than or equal to about 1.05, greater than or equal to about 1.06, greater than or equal to about 1.07, greater than or equal to about 1.08, greater than or equal to about 1.09, greater than or equal to about 1.1, greater than or equal to about 1.11, greater than or equal to about 1.12, greater than or equal to about 1.13, greater than or equal to about 1.14, greater than or equal to about 1.15, greater than or equal to about 1.16, greater than or equal to about 1.17, greater than or equal to about 1.18, greater than or equal to about 1.19, greater than or equal to about 1.2, greater than or equal to about 1.21, greater than or equal to about 1.22, greater than or equal to about 1.23, greater than or equal to about 1.24, or greater than or equal to about 1.25.

In one or more embodiments, a mole ratio may be a mole ratio for the semiconductor nanoparticle including indium and gallium as the Group 13 metal; and sulfur as the chalcogen element.

In the semiconductor nanoparticle of one or more embodiments, a mole ratio of sulfur to a sum of silver, indium, and gallium [S:(Ag+In+Ga)] may be greater than or equal to about 0.65:1, greater than or equal to about 0.68:1, greater than or equal to about 0.7:1, greater than or equal to about 0.75:1, greater than or equal to about 0.8:1, greater than or equal to about 0.85:1, greater than or equal to about 0.9:1, greater than or equal to about 0.95:1, greater than or equal to about 0.99:1, or greater than or equal to about 1.03:1. In the semiconductor nanoparticle, the mole ratio of sulfur to a sum of silver, indium, and gallium [S:(Ag+In+Ga)] may be less than or equal to about 1.35:1, less than or equal to about 1.33:1, less than or equal to about 1.3:1, less than or equal to about 1.25:1, less than or equal to about 1.2:1, less than or equal to about 1.17:1, less than or equal to about 1.15:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, less than or equal to about 1.01:1, less than or equal to about 1:1, or less than or equal to about 0.99:1.

In the semiconductor nanoparticle of one or more embodiments, a mole ratio of a sum of indium and gallium to silver [(In+Ga):Ag] may be greater than or equal to about 1.75:1, greater than or equal to about 1.8:1, greater than or equal to about 1.85:1, greater than or equal to about 1.9:1, greater than or equal to about 2:1, or greater than or equal to about 2.1:1. The mole ratio of a sum of indium and gallium to silver [(In+Ga):Ag] may be less than or equal to about 3.7:1, less than or equal to about 3.5:1, less than or equal to about 3.2:1, less than or equal to about 3:1, less than or equal to about 2.8:1, less than or equal to about 2.6:1, less than or equal to about 2.4:1, or less than or equal to about 2.3:1.

In the semiconductor nanoparticle of one or more embodiments, a mole ratio of gallium to a sum of indium and gallium [Ga:(Ga+In)] may be greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.84:1, greater than or equal to about 0.85:1, greater than or equal to about 0.86:1, greater than or equal to about 0.87:1, or greater than or equal to about 0.88:1. The mole ratio of gallium to a sum of indium and gallium [Ga:(Ga+In)] may be less than or equal to about 0.99:1, less than or equal to about 0.98:1, less than or equal to about 0.97:1, less than or equal to about 0.96:1, less than or equal to about 0.95:1, less than or equal to about 0.94:1, less than or equal to about 0.93:1, less than or equal to about 0.92:1, less than or equal to about 0.91:1, less than or equal to about 0.9:1, less than or equal to about 0.89:1, less than or equal to about 0.88:1, or less than or equal to about 0.87:1.

In the semiconductor nanoparticle, a mole ratio of gallium to sulfur (Ga:S) may be greater than or equal to about 0.1:1, greater than or equal to about 0.15:1, greater than or equal to about 0.2:1, greater than or equal to about 0.25:1, greater than or equal to about 0.3:1, greater than or equal to about 0.47:1, greater than or equal to about 0.49:1, greater than or equal to about 0.5:1, greater than or equal to about 0.52:1, greater than or equal to about 0.53:1, greater than or equal to about 0.55:1, greater than or equal to about 0.56:1, greater than or equal to about 0.58:1, greater than or equal to about 0.6:1, or greater than or equal to about 0.62:1. The mole ratio of gallium to sulfur (Ga:S) may be less than or equal to about 1:1, less than or equal to about 0.9:1, less than or equal to about 0.8:1, less than or equal to about 0.7:1, less than or equal to about 0.64:1, less than or equal to about 0.62:1, less than or equal to about 0.58:1, or less than or equal to about 0.55:1.

In the semiconductor nanoparticle, a mole ratio of silver to sulfur (Ag:S) may be greater than or equal to about 0.1:1, greater than or equal to about 0.15:1, greater than or equal to about 0.2:1, greater than or equal to about 0.25:1, greater than or equal to about 0.3:1, greater than or equal to about 0.31:1, greater than or equal to about 0.32:1, greater than or equal to about 0.33:1, greater than or equal to about 0.35:1, greater than or equal to about 0.38:1, greater than or equal to about 0.4:1, or greater than or equal to about 0.45:1. The mole ratio of silver to sulfur (Ag:S) may be less than or equal to about 1:1, less than or equal to about 0.6:1, less than or equal to about 0.5:1, less than or equal to about 0.4:1, less than or equal to about 0.38:1, or less than or equal to about 0.36:1.

In the semiconductor nanoparticle of one or more embodiments, a mole ratio of indium to sulfur (In:S) may be greater than or equal to about 0.01:1, greater than or equal to about 0.03:1, greater than or equal to about 0.05:1, greater than or equal to about 0.08:1, greater than or equal to about 0.09:1, greater than or equal to about 0.1:1, greater than or equal to about 0.11:1, or greater than or equal to about 0.14:1. The mole ratio of indium to sulfur (In:S) may be less than or equal to about 0.5:1, less than or equal to about 0.4:1, less than or equal to about 0.3:1, less than or equal to about 0.25:1, less than or equal to about 0.15:1, less than or equal to about 0.13:1, less than or equal to about 0.12:1, or less than or equal to about 0.11:1.

In the semiconductor nanoparticle of one or more embodiments, a mole ratio of a sum of indium and gallium to sulfur [(In+Ga):S] may be greater than or equal to about 0.64:1, greater than or equal to about 0.65:1, greater than or equal to about 0.66:1, greater than or equal to about 0.68:1, or greater than or equal to about 0.73:1. The mole ratio of the sum of indium and gallium to sulfur [(In+Ga):S] may be less than or equal to about 1.16:1, less than or equal to about 1.051:1, less than or equal to about 1:1, or less than or equal to about 0.73:1.

In the semiconductor nanoparticle, a mole ratio of silver to a sum of silver, indium, and gallium [Ag:(Ag+In+Ga)] may be greater than or equal to about 0.31:1, greater than or equal to about 0.32:1, greater than or equal to about 0.33:1, or greater than or equal to about 0.34:1. The mole ratio of silver to a sum of silver, indium, and gallium [Ag:(Ag+In+Ga)] may be less than or equal to about 0.45:1, less than or equal to about 0.4:1, less than or equal to about 0.39:1, less than or equal to about 0.385:1, less than or equal to about 0.37:1, less than or equal to about 0.36:1, or less than or equal to about 0.34:1.

In one or more embodiments, the semiconductor nanoparticle may not include lithium. In one or more embodiments, the semiconductor nanoparticle may not include an alkali metal such as sodium, potassium, or the like.

In the semiconductor nanoparticle, an amount of the indium may have a concentration gradient varying (decreasing) in a radial direction (e.g., from its center to its surface). In the semiconductor nanoparticle of one or more embodiments, an indium amount (or concentration) in a portion adjacent (proximate) to a surface (e.g., an outermost layer or a shell layer) of the semiconductor nanoparticle may be less than an indium amount (or concentration) of an inner portion or a core of the semiconductor nanoparticle. In one or more embodiments, a portion proximate (or adjacent) to a surface of the particle may not include indium.

In one or more embodiments, the semiconductor nanoparticle may include a first semiconductor nanocrystal and second semiconductor nanocrystal. The second semiconductor nanocrystal may be disposed on at least a portion of the first semiconductor nanocrystal. The second semiconductor nanocrystal may surround the first semiconductor nanocrystal. The first semiconductor nanocrystal may have a different composition from the second semiconductor nanocrystal. The semiconductor nanoparticle may further include an inorganic layer (for example, including a third semiconductor nanocrystal) including a zinc chalcogenide, for example as an outermost layer thereof. The zinc chalcogenide may include zinc; and selenium, sulfur, or a combination thereof. The zinc chalcogenide may include a zinc sulfide, a zinc selenide, a zinc sulfide selenide, or a combination thereof. A bandgap energy of the second semiconductor nanocrystal may be less than a bandgap energy of the third semiconductor nanocrystal.

The second semiconductor nanocrystal may be disposed between the first semiconductor nanocrystal and the inorganic layer.

A size (or average size, hereinafter, can be simply referred to as "size") of the first semiconductor nanocrystal may be greater than or equal to about 0.5 nm, greater than or equal to about 1 nm, greater than or equal to about 1.5 nm, greater than or equal to about 1.7 nm, greater than or equal to about 1.9 nm, greater than or equal to about 2 nm, greater than or equal to about 2.1 nm, greater than or equal to about 2.3 nm, greater than or equal to about 2.5 nm, greater than or equal to about 2.7 nm, greater than or equal to about 2.9 nm, greater than or equal to about 3 nm, greater than or equal to about 3.1 nm, greater than or equal to about 3.3 nm, greater than or equal to about 3.5 nm, greater than or equal to about 3.7 nm, or greater than or equal to about 3.9 nm. The size of the first semiconductor nanocrystal may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, or less than or equal to about 1.5 nm.

A thickness (or an average thickness, hereinafter, simply referred to as "thickness") of the second semiconductor nanocrystal may be greater than or equal to about 0.1 nm, greater than or equal to about 0.3 nm, greater than or equal to about 0.5 nm, greater than or equal to about 0.7 nm, greater than or equal to about 1 nm, greater than or equal to about 1.5 nm, greater than or equal to about 1.7 nm, greater than or equal to about 1.9 nm, greater than or equal to about 2 nm, greater than or equal to about 2.1 nm, greater than or equal to about 2.3 nm, greater than or equal to about 2.5 nm, greater than or equal to about 2.7 nm, greater than or equal to about 2.9 nm, greater than or equal to about 3 nm, greater than or equal to about 3.1 nm, greater than or equal to about 3.3 nm, greater than or equal to about 3.5 nm, greater than or equal to about 3.7 nm, or greater than or equal to about 3.9 nm. The thickness of the second semiconductor nanocrystal may be less than or equal to about 5 nm, less than or equal to about 4.5 nm, less than or equal to about 4 nm, less than or equal to about 3.5 nm, less than or equal to about 3 nm, less than or equal to about 2.5 nm, less than or equal to about 2 nm, or less than or equal to about 1.5 nm.

A thickness of the inorganic layer may be appropriately selected. The thickness of the inorganic layer may be less than or equal to about 5 nm, less than or equal to about 4 nm, less than or equal to about 3.5 nm, less than or equal to about 3 nm, less than or equal to about 2.5 nm, less than or equal to about 2 nm, less than or equal to about 1.5 nm, less than or equal to about 1 nm, or less than or equal to about 0.8 nm. The thickness of the inorganic layer may be greater than or equal to about 0.1 nm, greater than or equal to about 0.3 nm, greater than or equal to about 0.5 nm, or greater than or equal to about 0.7 nm. The thickness of the inorganic layer may be about 0.1 nm to about 5 nm, about 0.3 nm to about 4 nm, about 0.5 nm to about 3.5 nm, about 0.7 nm to about 3 nm, about 0.9 nm to about 2.5 nm, about 1 nm to about 2 nm, about 1.5 nm to about 1.7 nm, or a combination thereof.

The thickness of the outer layer may be about 0.01 times or more, about 0.03 times or more, about 0.05 times or more, about 0.07 times or more, about 0.1 times or more, about 0.12 times or more, about 0.15 times or more, about 0.17 times or more, about 0.2 times or more, about 0.23 times or more, about 0.25 times or more, about 0.27 times or more, about 0.3 times or more, about 0.32 times or more, about 0.35 times or more, about 0.37 times or more, about 0.39 times or more, about 0.4 times or more, or about 0.45 times or more of the (average) radius of the semiconductor nanoparticle. The thickness of the outer layer may be about 0.9 times or less, about 0.8 times or less, about 0.6 times or less, about 0.5 times or less, about 0.4 times or less, or about 0.35 times or less of the (average) radius of the semiconductor nanoparticle.

The first semiconductor nanocrystal may include silver, a Group 13 metal (e.g., indium, gallium, or a combination thereof), and a chalcogen element (e.g., sulfur, and optionally selenium). The first semiconductor nanocrystal may include a quaternary alloy semiconductor material based on a Group 11-13-16 compound including silver (Ag), indium, gallium, and sulfur. The first semiconductor nanocrystal may include silver indium gallium sulfide, e.g., $Ag(In_xGa_{1-x})S_2$ (x is greater than 0 and less than 1). The mole ratios between the components in the first semiconductor nanocrystal may be adjusted so that the final semiconductor nanoparticle may have a desired composition and an optical property (e.g., a maximum emission wavelength).

The second semiconductor nanocrystal may include a Group 13 metal (indium, gallium, or a combination thereof), and a chalcogen element (sulfur, and optionally selenium). The second semiconductor nanocrystal may further include silver (Ag). The second semiconductor nanocrystal may include silver, gallium, and sulfur. The second semiconductor nanocrystal may include a ternary alloy semiconductor material including silver, gallium, and sulfur. The second semiconductor nanocrystal may have a different composition from that of the first semiconductor nanocrystal. The second semiconductor nanocrystal may include a Group 13-16 compound, a Group 11-13-16 compound, or a combination thereof. The Group 13-16 compound may include gallium sulfide, gallium selenide, indium sulfide, indium selenide, indium gallium sulfide, indium gallium selenide, indium gallium selenide sulfide, or a combination thereof. An energy bandgap of the second semiconductor nanocrystal may be different from that of the first semiconductor nanocrystal. The second semiconductor nanocrystal may cover at least a portion of the first semiconductor nanocrystal. An energy bandgap of the second semiconductor nanocrystal may be greater than an energy bandgap of the first semiconductor nanocrystal. An energy bandgap of the second semiconductor nanocrystal may be less than an energy bandgap of the first semiconductor nanocrystal. The molar ratios between each component in the second semiconductor nanocrystal may be adjusted so that the final semiconductor nanoparticle exhibits a desired composition and optical properties.

The second semiconductor nanocrystal or the first semiconductor nanocrystal may exhibit crystallinity when confirmed by, for example, an appropriate analytical means (e.g., an X-ray diffraction analysis, an electron microscope analysis such as high angle annular dark field (HAADF)-scanning transmission electron microscope (STEM) analysis, or the like). In one or more embodiments, the first semiconductor nanocrystal or the second semiconductor nanocrystal may be, for example, amorphous when confirmed by an appropriate analysis means.

A particle size (or an average particle size, hereinafter, simply referred to as "particle size") of the semiconductor nanoparticle may be greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, greater than or equal to about 10 nm, or greater than or equal to about 10.5 nm. The particle size of the semiconductor nanoparticle may be less than or equal to about 50 nm, less than or equal to about 48 nm, less than or equal to about 46 nm, less than or equal to about 44 nm, less than or equal to about 42 nm, less than or equal to about 40 nm, less than or equal to about 35 nm, less than or equal to about 30 nm, less than or equal to about 25 nm, less than or equal to about 20 nm, less than or equal to about 18 nm, less than or equal to about 16 nm, less than or equal to about 14 nm, less than or equal to about 12 nm, less than or equal to about 11 nm, less than or equal to about 10 nm, less than or equal to about 8 nm, less than or equal to about 6 nm, or less than or equal to about 4 nm. As used herein, the particle size of the semiconductor nanoparticle may be a particle diameter. The particle size of the semiconductor nanoparticle may be an equivalent diameter thereof that is obtained by a calculation involving a conversion of a two-dimensional area of a transmission electron microscopy image of a given particle into a circle. The particle size may be a value (e.g., a nominal particle size) calculated from a composition and a maximum emission wavelength of the semiconductor nanoparticle.

The semiconductor nanoparticle of one or more embodiments may be configured to emit a desired light (e.g., a first light) while exhibiting improved properties.

A maximum emission wavelength of the first light or a maximum emission wavelength of the semiconductor nanoparticle may be greater than or equal to about 500 nm, greater than or equal to about 505 nm, greater than or equal to about 510 nm, greater than or equal to about 515 nm, greater than or equal to about 520 nm, greater than or equal to about 525 nm, greater than or equal to about 530 nm, greater than or equal to about 535 nm, greater than or equal to about 540 nm, greater than or equal to about 545 nm, greater than or equal to about 550 nm, greater than or equal to about 555 nm, greater than or equal to about 560 nm, greater than or equal to about 565 nm, greater than or equal to about 570 nm, greater than or equal to about 575 nm, greater than or equal to about 580 nm, greater than or equal to about 585 nm, or greater than or equal to about 590 nm. The maximum emission wavelength of the first light of the semiconductor nanoparticle may be less than or equal to about 600 nm, less than or equal to about 595 nm, less than or equal to about 590 nm, less than or equal to about 580 nm, less than or equal to about 575 nm, less than or equal to about 570 nm, less than or equal to about 565 nm, less than or equal to about 560 nm, less than or equal to about 555 nm, less than or equal to about 550 nm, less than or equal to about 545 nm, less than or equal to about 540 nm, less than or equal to about 535 nm, less than or equal to about 530 nm, less than or equal to about 525 nm, less than or equal to about 520 nm, or less than or equal to about 515 nm.

A full width at half maximum (FWHM) of the first light or a FWHM of the semiconductor nanoparticle may be greater than or equal to about 5 nm, greater than or equal to about 10 nm, greater than or equal to about 15 nm, greater than or equal to about 20 nm, greater than or equal to about 25 nm, or greater than or equal to about 30 nm. The full width at half maximum may be less than or equal to about 70 nm, less than or equal to about 65 nm, less than or equal to about 60 nm, less than or equal to about 55 nm, less than or equal to about 50 nm, less than or equal to about 45 nm, less than or equal to about nm, less than or equal to about 38 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

The semiconductor nanoparticle may exhibit a quantum yield of greater than or equal to about 50%. The quantum yield may be an absolute quantum yield. The quantum yield may be greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or greater than or equal to about 95%. The quantum yield may be less than or equal to about 100%, less than or equal to about 99.5%, less than or equal to about 99%, less than or equal to about 98%, or less than or equal to about 97%.

The first light may include band-edge emission. In one or more embodiments, the first light emitted by the semiconductor nanoparticle may further include a defect site emission or a trap emission. The band-edge emission may be centered at a higher energy (a lower wavelength) with a smaller offset from the absorption onset energy compared to the trap emission. The band-edge emission may have a narrower wavelength distribution than the trap emission. The band-edge emission may have a normal (e.g., Gaussian) wavelength distribution.

A difference between the band-edge maximum emission wavelength and the trap maximum emission wavelength may be, for example, greater than or equal to about 80 nm, greater than or equal to about 90 nm, or about 100 nm.

In one or more embodiments, at least about 90% of the emission of the semiconductor nanoparticle may represent band-edge emission. A percentage of a band-edge emission may be calculated by fitting the Gaussian peaks (e.g., two or more) of the emission spectrum of the semiconductor nanoparticle, and comparing an area of the peak closer in energy to the bandgap of the semiconductor nanoparticle (representing the band-edge emission) with respect to the sum of all peak areas (e.g., the sum of band-edge emission and trap emission).

The percentage of the band-edge emission may be greater than or equal to about 95%, greater than or equal to about 95.5%, greater than or equal to about 96%, greater than or equal to about 96.5%, greater than or equal to about 97%, greater than or equal to about 97.5%, greater than or equal to about 98%, greater than or equal to about 98.5%, greater than or equal to about 99%, or greater than or equal to about 99.5%. The semiconductor nanoparticle of one or more embodiments may have a band-edge emission percentage of substantially 100%.

In the photoluminescence spectrum of the semiconductor nanoparticle, a ratio of an area of the tail emission peak (e.g., the maximum emission wavelength+at least about 70 nm, at least about 80 nm, at least about 90 nm, or at least about 100 nm) to a total area of the emission peak may be less than or equal to about 20%, less than or equal to about 15%, less than or equal to about 12%, less than or equal to about 10%, less than or equal to about 9%, less than or equal to about 8%, less than or equal to about 7%, less than or equal to about 6%, less than or equal to about 5%, less than or equal to about 4%, less than or equal to about 3%, or less than or equal to about 2%.

In the photoluminescence spectrum of the semiconductor nanoparticle, a relative light emission (e.g., band-edge emission) intensity defined by the following Equation 2 may be greater than about 20, or greater than or equal to about 25:

$$\text{relative light emission (e.g., band-edge emission) intensity} = A1/A2 \qquad \text{Equation 2}$$

wherein, in Equation 2,

A1 is an intensity at the maximum emission wavelength, and

A2 is a maximum intensity in a tail wavelength range of the maximum emission wavelength+greater than or equal to about 80 nm (for example, greater than or equal to about 85 nm, greater than or equal to about 90 nm, greater than or equal to about 95 nm, greater than or equal to about 100 nm, greater than or equal to about 120 nm, greater than or equal to about 150 nm, greater than or equal to about 180 nm, or up to about 200 nm).

An upper limit of the wavelength range in A2 or the tail emission wavelength range may be a wavelength at which an intensity of the spectrum becomes zero. In an embodiment, the wavelength range may be the maximum emission wavelength+less than or equal to about 200 nm or less than or equal to about 120 nm, but is not limited thereto.

Without wishing to be bound by any theory, in the above equation, A1 may represent the band-edge emission and A2 may be substantially related to the trap emission.

The present inventors have found that it may be difficult to suppress or remove a trap emission in the semiconductor nanoparticle including on a Group 13-16 compound with silver prepared by a conventional method. Surprisingly, the present inventors have found that the semiconductor nanoparticle of one or more embodiments prepared by the method described herein may exhibit an emission spectrum in which the trap emission is substantially suppressed or removed.

Accordingly, in one or more embodiments, a relative light emission intensity of the semiconductor nanoparticle may be greater than or equal to about 21, greater than or equal to about 23, greater than or equal to about 25, greater than or equal to about 27, greater than or equal to about 29, greater than or equal to about 31, greater than or equal to about 33, greater than or equal to about 35, greater than or equal to about 37, greater than or equal to about 39, greater than or equal to about 41, greater than or equal to about 43, greater than or equal to about 45, greater than or equal to about 47, greater than or equal to about 49, greater than or equal to about 51, greater than or equal to about 53, greater than or equal to about 55, greater than or equal to about 57, greater than or equal to about 59, greater than or equal to about 61, greater than or equal to about 63, greater than or equal to about 65, greater than or equal to about 67, greater than or equal to about 69, greater than or equal to about 71, greater than or equal to about 73, greater than or equal to about 75, greater than or equal to about 77, greater than or equal to about 79, greater than or equal to about 81, greater than or equal to about 83, greater than or equal to about 85, greater than or equal to about 87, greater than or equal to about 89, greater than or equal to about 91, greater than or equal to about 93, greater than or equal to about 95, greater than or equal to about 97, greater than or equal to about 99, or greater than or equal to about 100.

In one or more embodiments, the relative light emission intensity may be less than or equal to about 150, less than or equal to about 140, less than or equal to about 130, less than or equal to about 120, less than or equal to about 100, less than or equal to about 90, or less than or equal to about 80.

In one or more embodiments, a method of producing the semiconductor nanoparticle includes obtaining a first semiconductor nanocrystal including a silver, a Group 13 metal, and a chalcogen element; preparing a reaction medium including a first precursor, an organic ligand, and an organic solvent; and heating the reaction medium to a first temperature;

adding the first semiconductor nanocrystal and a second precursor to the reaction medium to obtain a reaction mixture, wherein one of the first precursor and the second precursor is a gallium precursor and the other is a sulfur precursor; and heating the reaction medium to a second temperature and reacting for a first reaction time to form the semiconductor nanoparticle, wherein the first temperature is greater than or equal to about 120° C. (e.g., greater than or equal to about 180° C.) to less than or equal to about 280° C., and the second temperature is greater than or equal to about 180° C. (or greater than or equal to about 190° C. or greater than or equal to about 240° C.) to less than or equal to about 380° C. The first reaction time may be controlled to obtain a charge balance value as described herein for the semiconductor nanoparticle. The first temperature and the second temperature may be different. The second temperature may be higher than the first temperature. The second temperature may be lower than the first temperature.

The details of the first semiconductor nanocrystal, the second semiconductor nanocrystal, and the charge balance value are as described herein.

In one or more embodiments, the first precursor may be a gallium precursor, and the second precursor may be a sulfur precursor. In one or more embodiments, the first precursor may be a sulfur precursor, and the second precursor may be a gallium precursor. According to the method of one or more embodiments, oxidation of the gallium precursor may be suppressed efficiently.

In one or more embodiments, the method may further include preparing an additional reaction medium including an organic ligand and a zinc precursor in an organic solvent; heating the additional reaction medium to a reaction temperature; adding the semiconductor nanoparticle formed above and a chalcogen precursor to conduct a reaction and to provide an outer layer including zinc chalcogenide on the semiconductor nanoparticle. The chalcogen precursor may include a sulfur precursor, a selenium precursor, or a combination thereof. Details of the reaction temperature are as described herein for the second temperature.

The detailed description about the first semiconductor nanocrystal is as described herein. The first semiconductor nanocrystal may include silver (Ag), indium, gallium, and sulfur. A method of producing the first semiconductor nanocrystal is not particularly limited and may be appropriately selected. In one or more embodiments, the first semiconductor nanocrystal may be obtained by reacting the required precursors depending on the composition, such as a silver precursor, an indium precursor, a gallium precursor, and a sulfur precursor in a solution including an organic ligand and an organic solvent at a predetermined reaction temperature (e.g., about 20° C. to about 300° C., about 80° C. to about 295° C., about 120° C. to about 290° C., or about 200° C. to about 280° C.) and separating the same. For separation and recovery, a method to be described herein may be referred to.

In the preparation of the first semiconductor nanocrystal, mole ratios among the precursors may be controlled to obtain a desired composition of the first semiconductor nanocrystal. In one or more embodiments, an amount of the silver (Ag) precursor may be, per one mole of indium, greater than or equal to about 0.1 moles, greater than or equal to about 0.3 moles, greater than or equal to about 0.5 moles, greater than or equal to about 0.7 moles, greater than or equal to about 1 mole, greater than or equal to about 1.5 moles, greater than or equal to about 2 moles, or greater than or equal to about 2.5 moles. In one or more embodiments, an amount of the silver (Ag) precursor may be, per one mole of indium, less than or equal to about 10 moles, less than or equal to about 8 moles, less than or equal to about 6 moles, less than or equal to about 4 moles, less than or equal to about 2 moles, less than or equal to about 1.2 moles, less than or equal to about 1 mole, or less than or equal to about 0.5 moles. In one or more embodiments, an amount of the silver (Ag) precursor may be, per one mole of indium, greater than or equal to about 0.5 moles to less than or equal to about 1.2 moles.

In one or more embodiments, an amount of the gallium precursor may be, per one mole of indium, greater than or equal to about 0.5 moles, greater than or equal to about 1 mole, greater than or equal to about 1.5 moles, greater than or equal to about 2 moles, or greater than or equal to about 2.5 moles. In one or more embodiments, an amount of the gallium precursor may be, per one mole of indium, less than or equal to about 15 moles, less than or equal to about 12 moles, less than or equal to about 10 moles, less than or equal to about 8 moles, less than or equal to about 5 moles, or less than or equal to about 3 moles.

In one or more embodiments, an amount of the sulfur precursor may be, per one mole of indium, greater than or equal to about 0.5 moles, greater than or equal to about 1 mole, greater than or equal to about 1.5 moles, greater than or equal to about 2 moles, greater than or equal to about 2.5 moles, greater than or equal to about 3 moles, greater than or equal to about 3.5 moles, greater than or equal to about 4 moles, or greater than or equal to about 4.5 moles. In one or more embodiments, an amount of the sulfur precursor may be, per one mole of indium, less than or equal to about 20 moles, less than or equal to about 15 moles, less than or equal to about 10 moles, less than or equal to about 8 moles, less than or equal to about 6 moles, less than or equal to about 4 moles, or less than or equal to about 2 moles.

A difference between the first temperature and the second temperature may be greater than or equal to about 10° C., greater than or equal to about 20° C., greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The difference between the first temperature and the second temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., less than or equal to about 90° C., less than or equal to about 80° C., less than or equal to about 70° C., less than or equal to about 60° C., less than or equal to about 50° C., less than or equal to about 40° C., less than or equal to about 30° C., or less than or equal to about 20° C.

The first temperature may be greater than or equal to about 120° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 280° C., less than or equal to about 275° C., less than or equal to about 270° C., less than or equal to about 265° C., less than or equal to about 260° C., less than or equal to about 255° C., less than or equal to about 250° C., less than or equal to about 240° C., less than or equal to about 230° C., less than or equal to about 220° C., less than or equal to about 210° C., less than or equal to about 200° C., less than or equal to about 190° C., less than or equal to about 180° C., less than or equal to about 170° C., less than or equal to about 160° C., or less than or equal to about 150° C.

The second temperature may be greater than or equal to about 240° C., greater than or equal to about 245° C., greater than or equal to about 250° C., greater than or equal to about 255° C., greater than or equal to about 260° C., greater than or equal to about 265° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., greater than or equal to about 315° C., greater than or equal to about 320° C., greater than or equal to about 330° C., greater than or equal to about 335° C., greater than or equal to about 340° C., or greater than or equal to about 345° C. The second temperature may be less than or equal to about 380° C., less than or equal to about 375° C., less than or equal to about 370° C., less than or equal to about 365° C., less than or equal to about 360° C., less than or equal to about 355° C., less than or equal to about 350° C., less than or equal to about 340° C., less than or equal to about 330° C., less than or equal to about 320° C., less than or equal to about 310° C., less than or equal to about 300° C., less than or equal to about 290° C., less than or equal to about 280° C., less than or equal to about 270° C., less than or equal to about 260° C., or less than or equal to about 250° C.

The first reaction time may be controlled to obtain a charge balance value of the semiconductor nanoparticle. Surprisingly, the present inventors have found that by controlling the first temperature and the second temperature and the first reaction time in the aforementioned reaction, generation of side reaction products (e.g., gallium oxide) may be effectively suppressed during the formation of a semiconductor nanoparticle, and whereby the final semiconductor nanoparticle may have the charge balance value described herein (optionally together with the molar ratios between each component described herein), which may contribute to achieving the properties of the semiconductor nanoparticle described herein.

In one or more embodiments, the first reaction time may be about 1 minute to about 200 minutes, about 10 minutes to about 3 hours, about 20 minutes to about 150 minutes, or about 30 minutes to about 100 minutes. The first reaction time may be selected taking into consideration the types of precursors, the reaction temperature, the desired composition of the final particles, or the like. In one or more embodiments, the second temperature may be within a relatively high temperature range (e.g., greater than or equal to about 280° C., about 285° C. to about 340° C., or about 290° C. to about 330° C.), and the first reaction time may be greater than or equal to about 1 minute, greater than or equal to about 5 minutes, greater than or equal to about 10 minutes, greater than or equal to about 15 minutes, greater than or equal to about 20 minutes, or greater than or equal to about 25 minutes to less than or equal to about 2 hours, less than or equal to about 90 minutes, less than or equal to about 80 minutes, less than or equal to about 70 minutes, less than or equal to about 60 minutes, less than or equal to about 50 minutes, less than or equal to about 45 minutes, less than or equal to about 40 minutes, less than or equal to about 35 minutes, less than or equal to about 25 minutes, less than or equal to about 20 minutes, less than or equal to about 15 minutes, or less than or equal to about 12 minutes. In one or more embodiments, the second temperature may be within a relatively low temperature range (e.g., less than about 290° C., less than or equal to about 280° C., less than or equal to about 270° C., less than or equal to about 260° C., less than or equal to about 250° C., less than or equal to about 240° C., less than or equal to about 230° C., less than or equal to about 220° C., or less than or equal to about 210° C.) and the first reaction time may be greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, greater than or equal to about 60 minutes, greater than or equal to about 65 minutes, greater than or equal to about 70 minutes, greater than or equal to about 75 minutes, or greater than or equal to about 80 minutes.

A type of the silver precursor is not particularly limited and may be selected appropriately. The silver precursor may include a silver powder, an alkylated silver compound, a silver alkoxide, a silver carboxylate, a silver acetylacetonate, a silver nitrate, a silver sulfate, a silver halide, a silver cyanide, a silver hydroxide, a silver oxide, a silver peroxide, a silver carbonate, or a combination thereof. The silver precursor may include a silver nitrate, a silver acetate, a silver acetylacetonate, a silver chloride, a silver bromide, a silver iodide, or a combination thereof.

A type of the indium precursor is not particularly limited and may be selected appropriately. The indium precursor may include an indium powder, an alkylated indium compound, an indium alkoxide, an indium carboxylate, an indium nitrate, an indium perchlorate, an indium sulfate, an indium acetylacetonate, an indium halide, an indium cyanide, an indium hydroxide, an indium oxide, an indium peroxide, an indium carbonate, an indium acetate, or a combination thereof. The indium precursor may include an indium carboxylate such as indium oleate and indium myristate, an indium acetate, an indium hydroxide, an indium chloride, an indium bromide, an indium iodide, or a combination thereof.

A type of the gallium precursor is not particularly limited and may be appropriately selected. The gallium precursor may include a gallium powder, an alkylated gallium compound, a gallium alkoxide, a gallium carboxylate, a gallium nitrate, a gallium perchlorate, a gallium sulfate, a gallium acetylacetonate, a gallium halide, a gallium cyanide, a gallium hydroxide, a gallium oxide, a gallium peroxide, a gallium carbonate, or a combination thereof. The gallium precursor may include a gallium chloride, a gallium iodide, a gallium bromide, a gallium acetate, a gallium acetylacetonate, a gallium oleate, a gallium palmitate, a gallium stearate, a gallium myristate, a gallium hydroxide, or a combination thereof.

A type of the sulfur precursor is not particularly limited and may be appropriately selected. The sulfur precursor may be an organic solvent dispersion or a reaction product of sulfur and an organic solvent, for example, a octadecene sulfide (S-ODE), a trioctylphosphine-sulfide (S-TOP), a tributylphosphine-sulfide (S-TBP), a triphenylphosphinesulfide (S-TPP), a trioctylamine-sulfide (S-TOA), a bis (trimethylsilylalkyl) sulfide, a bis(trimethylsilyl) sulfide, a mercapto propyl silane, an ammonium sulfide, a sodium sulfide, a C1-30 thiol compound (e.g., α-toluene thiol, octane thiol, dodecanethiol, octadecene thiol, or the like), an isothiocyanate compound (e.g., cyclohexyl isothiocyanate or the like), an alkylenetrithiocarbonate (e.g., ethylene trithiocarbonate or the like), allyl mercaptan, a thiourea compound (e.g., (di)alkylthiourea having a C1 to C40 alkyl group, for example, methylthiourea, dimethylthiourea, ethylthiourea, diethyl thiourea, ethyl methyl thiourea, dipropyl thiourea, or the like; or an arylthiourea such as a phenyl thiourea), or a combination thereof.

The selenium precursor, if present, may include selenium-trioctylphosphine (Se-TOP), selenium-tributylphosphine (Se-TBP), selenium-triphenylphosphine (Se-TPP), or a combination thereof.

A type of the zinc precursor is not particularly limited and may be appropriately selected. In one or more embodiments, the zinc precursor may include a Zn metal powder, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO $(OH)_2$, RHPOOH, RHPOOH (wherein, R and R' are each independently substituted or unsubstituted C1 to C40 (or C3 to C24) aliphatic hydrocarbon (e.g., alkyl group, alkenyl group, or alkynyl group), or a substituted or unsubstituted C6 to C40 (or a C6 to C24) aromatic hydrocarbon (e.g., a C6 to C20 aryl group), or a combination thereof. The organic ligand may be bound to the surface of the nanoparticles. Non-limiting examples of the organic ligand may include methane thiol, ethane thiol, propane thiol, butane thiol, pentane thiol, hexane thiol, heptane thiol, octane thiol, nonanethiol, decanethiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; substituted or unsubstituted methyl phosphine (e.g., trimethyl phosphine, methyldiphenyl phosphine, or the like), substituted or unsubstituted ethyl phosphine (e.g., triethyl phosphine, ethyldiphenyl phosphine, or the like), substituted or unsubstituted propyl phosphine, substituted or unsubstituted butyl phosphine, substituted or unsubstituted pentyl phosphine, substituted or unsubstituted octylphosphine (e.g., trioctylphosphine (TOP)), or the like; a phosphine oxide such as substituted or unsubstituted methyl phosphine oxide (e.g., trimethyl phosphine oxide, methyldiphenylphosphine oxide, or the like), substituted or unsubstituted ethyl phosphine oxide (e.g., triethyl phosphine oxide, ethyldiphenyl phosphine oxide, or the like), substituted or unsubstituted propyl phosphine oxide, substituted or unsubstituted butyl phosphine oxide, substituted or unsubstituted octylphosphine oxide (e.g., trioctylphosphine oxide (TOPO), or the like); diphenyl phosphine, a triphenyl phosphine compound, or an oxide compound thereof; a C5 to C20 alkylphosphinic acid or a C5 to C20 alkyl phosphonic acid such as phosphonic acid, hexylphosphinic acid, octylphosphinic acid, dodecanephosphinic acid, tetradecanephosphinic acid, hexadecanephosphinic acid, octadecanephosphinic acid, or the like, but embodiments are not limited thereto. The organic ligand may be used alone or as a mixture of two or more.

The organic solvent may include an amine solvent (e.g., an aliphatic amine for example having a C1 to C50 aliphatic amine), a nitrogen-containing heterocyclic compound such as pyridine; a C6 to C40 aliphatic hydrocarbon (e.g., alkane, alkene, alkyne, or the like) such as hexadecane, octadecane, octadecene, or squalene; a C6 to C30 aromatic hydrocarbon such as phenyldodecane, phenyltetradecane, phenyl hexadecane, or the like; a phosphine substituted with a C6 to C22 alkyl group such as trioctylphosphine; a phosphine oxide substituted with a C6 to C22 alkyl group such as trioctylphosphine oxide, or the like; a C12 to C22 aromatic ether such as phenyl ether, or benzyl ether, or the like; or a combination thereof. The amine solvent may be a compound having one or more (e.g., two or three) C1-50, C2-45, C3-40, C4-35, C5-30, C6-25, C7-20, C8-15, or C6-22 aliphatic hydrocarbon groups (alkyl group, alkenyl group, or alkynyl group). In one or more embodiments, the amine solvent may be a C6-22 primary amine such as hexadecyl amine and oleylamine; secondary amines of C6-22 such as dioctyl amine or the like; C6-22 tertiary amines such as trioctylamine or the like; or a combination thereof.

Amounts of the organic ligand and the precursors in the reaction medium may be selected appropriately in consideration of the type of solvent, the type of the organic ligand and each precursor, and the size and composition of desired particles. Mole ratios between the precursors may be changed taking into consideration the desired mole ratios in the final nanoparticle, the reactivities among the precursors, or the like. In one or more embodiments, a manner of adding each of the precursors is not particularly limited. In one or more embodiments, a total amount of a precursor may be added at one time. In one or more embodiments, a total amount of a precursor may be divided and added into greater than or equal to about 2 aliquots and less than or equal to about 10 aliquots. The precursors may be added simultaneously or sequentially in a predetermined order. The reaction may be carried out in an inert gas atmosphere, in air, or in a vacuum state, but embodiments are not limited thereto.

In one or more embodiments, after the completion of the reaction, a nonsolvent may be added to a final reaction solution to facilitate separation (e.g., precipitation) of a semiconductor nanoparticle as synthesized (for example, with a coordinating organic ligand). The nonsolvent may be a polar solvent that is miscible with the solvent used in the reaction, but cannot disperse the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed by centrifugation, precipitation, chromatography, or distillation. Separated nanocrystals may be washed by adding to a washing solvent as needed. The washing solvent is not particularly limited, and a solvent having a solubility parameter similar to that of the organic solvent or ligand may be used. The nonsolvent or washing solvent may be an alcohol; an alkane solvent such as hexane, heptane, octane, or the like; an aromatic solvent such as chloroform; toluene, benzene, or the like; or a combination thereof, but embodiments are not limited thereto.

The semiconductor nanoparticle thus prepared may be dispersed in a dispersion solvent. The semiconductor nanoparticle thus prepared may form an organic solvent dispersion. The organic solvent dispersion may not include water and/or an organic solvent miscible with water. The dispersion solvent may be appropriately selected. The dispersion solvent may include the aforementioned organic solvent. The dispersion solvent may include a substituted or unsubstituted C1 to C40 aliphatic hydrocarbon, a substituted or unsubstituted C6 to C40 aromatic hydrocarbon, or a combination thereof.

A shape of the semiconductor nanoparticle thus prepared is not particularly limited, and may include, for example, spherical, polyhedral, pyramidal, multipod, cubic, nanotubes, nanowires, nanofibers, nanosheets, or a combination thereof, but embodiments are not limited thereto.

The semiconductor nanoparticle of one or more embodiments may include an organic ligand and/or an organic solvent on a surface of the semiconductor nanoparticle. The organic ligand and/or the organic solvent may be bound to a surface of the semiconductor nanoparticle of one or more embodiments.

In one or more embodiments, a composite may include a matrix; and the semiconductor nanoparticle described herein, wherein the semiconductor nanoparticle may be dispersed in the matrix. The semiconductor nanoparticle described herein or the composite including the semiconductor nanoparticle may exhibit an increased level of blue light absorbance (e.g., an improved incident light absorbance) and/or improved optical properties (e.g., an increased luminous efficiency and a narrower full width at half maximum), and may emit light of a desired wavelength (e.g., first light). In one or more embodiments, the composite may have a sheet form. In one or more embodiments, the composite may be in the form of a patterned film.

The composite may include the semiconductor nanoparticle or a population thereof (e.g., in a predetermined amount), exhibiting increased incident light absorbance. An incident light absorbance of the composite may be greater than or equal to about 70%, greater than or equal to about 73%, greater than or equal to about 75%, greater than or equal to about 77%, greater than or equal to about 78%, than or equal to about 80%, greater than or equal to about 83%, greater than or equal to about 85%, greater than or equal to about 87%, greater than or equal to about 90%, greater than or equal to about 93%, greater than or equal to about 94%, greater than or equal to about 95%, greater than or equal to about 96%, greater than or equal to about 97%, greater than or equal to about 98%, or greater than or equal to about 99%. The blue light absorbance of the composite may be about 70% to about 100%, about 80% to about 98%, about 95% to about 99%, about 96% to about 98%, or a combination thereof. The incident light absorbance may be determined using Equation 3:

$$\text{incident light absorbance}=[(B-B')/B]\times 100(\%) \qquad \text{Equation 3}$$

wherein, in Equation 3,

- B is an amount of incident light provided to the composite, and
- B' is an amount of incident light passing through the composite.
- A light conversion efficiency (CE) of the composite may be greater than or equal to about 7%, greater than or equal to about 8%, greater than or equal to about 9%, greater than or equal to about 10%, greater than or equal to about 11%, greater than or equal to about 12%, greater than or equal to about 12.5%, greater than or equal to about 12.9%, greater than or equal to about 13%, greater than or equal to about 14.5%, greater than or equal to about 15%, greater than or equal to about 15.5%, greater than or equal to about 16%, greater than or equal to about 16.5%, greater than or equal to about 16.7%, or greater than or equal to about 16.9%:

$$\text{light conversion efficiency}=[A/(B-B')]\times 100\%$$

- A is an amount of a first light emitted from the composite,
- B is an amount of incident light provided to the composite, and
- B' is an amount of incident light passing through the composite.

In one or more embodiments, a color conversion layer (e.g., a color conversion structure) may include the semiconductor nanoparticle as described herein. The color conversion layer or the color conversion structure may include the composite of one or more embodiments or a patterned film of the composite.

Figure 1B:
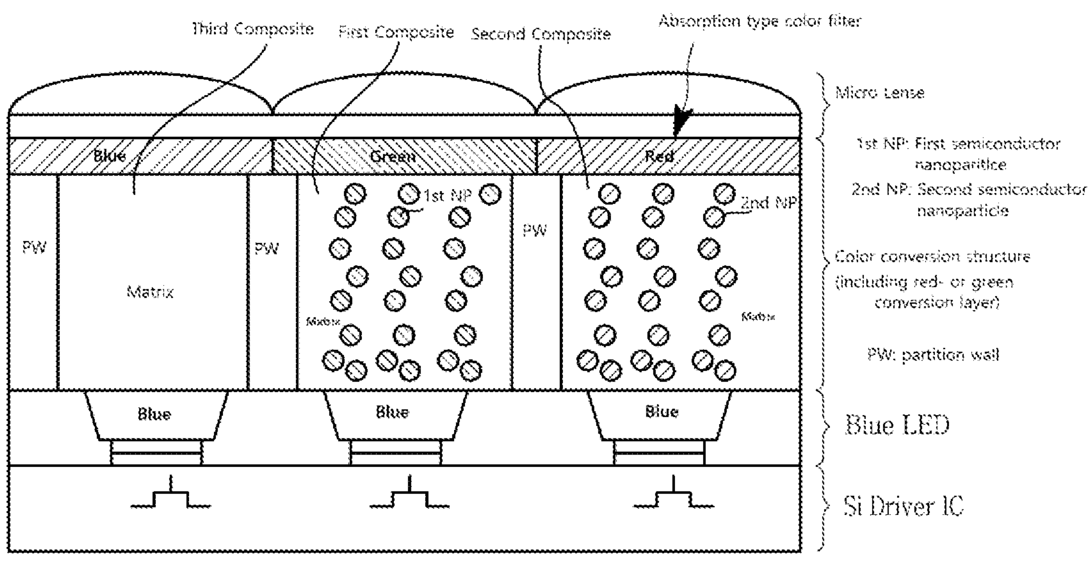
FIG. 1B is a cross-sectional view of an electronic device (display device) including a color conversion panel according to one or more embodiments.

FIG. 1A is a schematic cross-sectional view of a color conversion panel according to one or more embodiments. Referring to FIG. 1A, the color conversion panel may optionally further include a partition wall (e.g., a black matrix (BM), a bank, or a combination thereof) that defines each region of the color conversion layer (e.g., a color conversion structure). FIG. 1B illustrates an electronic device (a display device) including a color conversion panel and a light source according to another embodiment. In the electronic device of one or more embodiments, a color conversion panel including a color conversion layer or a color conversion structure may be disposed on an LED on chip (e.g., a micro LED on chip). Referring to FIG. 1B, a circuit (Si driver IC) configured to drive the light source may be disposed under a light source (e.g., a blue LED) configured to emit an incident light (e.g., a blue light). The color conversion layer may include a first composite including a plurality of semiconductor nanoparticles emitting a first light (e.g., a green light), and a second composite including a plurality of semiconductor nanoparticles emitting a second light (e.g., a red light), or a third composite that emits or passes a third light (e.g., incident light or a blue light). A partition wall PW (e.g., including an inorganic material such as silicon or silicon oxide, or based on an organic material) may be disposed between respective composites. The partition wall may include a trench hole, a via hole, or a combination thereof. A first optical element (e.g., an absorption type color filter) may be disposed on a light extraction surface of a color conversion layer. An additional optical element such as a micro lens may be further disposed on the first optical element.

The color conversion region may include a first region configured to emit the first light (or a green light) (e.g., by irradiation with an incident light). In one or more embodiments, the first region may correspond to a green pixel. The first region includes a first composite (e.g., a luminescence type composite). The first light may have a maximum emission wavelength within a wavelength range to be described herein. The first light will be described in further detail for the semiconductor nanoparticle as described herein. The maximum emission wavelength of the green light may be greater than or equal to about 500 nm, greater than or equal to about 501 nm, greater than or equal to about 504 nm, greater than or equal to about 505 nm, or greater than or equal to about 520 nm. The maximum emission wavelength of the green light may be less than or equal to about 580 nm, less than or equal to about 560 nm, less than or equal to about 550 nm, less than or equal to about 530 nm, less than or equal to about 525 nm, less than or equal to about 520 nm, less than or equal to about 515 nm, or less than or equal to about 510 nm.

The color conversion region may further include one or more second regions that are configured to emit a second light (e.g., a red light) different from the first light (e.g., by irradiation with excitation light). The second region may include a second composite. The semiconductor nanoparticle composite in the second region may include a semiconductor nanoparticle (e.g., a quantum dot) being configured to emit a light of a different wavelength (e.g., a different color) from the semiconductor nanoparticle composite disposed in the first region.

The second light may be a red light having a maximum emission wavelength of about 600 nm to about 650 nm (e.g., about 620 nm to about 650 nm). The color conversion panel may further include one or more third regions that emit or pass a third light (e.g., a blue light) different from the first light and the second light. An incident light may include the third light (e.g., a blue light) and optionally a green light). The third light may include a blue light having a maximum emission wavelength of greater than or equal to about 380 nm (e.g., greater than or equal to about 440 nm, greater than or equal to about 445 nm, greater than or equal to about 450 nm, or greater than or equal to about 455 nm) to less than or equal to about 480 nm (e.g., less than or equal to about 475 nm, less than or equal to about 470 nm, less than or equal to about 465 nm, or less than or equal to about 460 nm).

In one or more embodiments, a color conversion panel includes a color conversion layer or a color conversion structure that includes a color conversion region including a first region. The composite of the embodiment may be disposed in the first region. The color conversion region may include a plurality of the first regions disposed in a predetermined pattern, each of the first regions may include the composite of the embodiment or a pattern thereof. The composite (or a pattern thereof) may be prepared from the (ink) composition by any suitable method, for example, in a photolithography manner or in an inkjet printing manner. Accordingly, one or more embodiments also relates to an ink composition including a liquid vehicle and the semiconductor nanoparticle as described herein. The semiconductor nanoparticle may be dispersed in the liquid vehicle.

The liquid vehicle may include a liquid monomer, an organic solvent, or a combination thereof. The ink composition may further include a metal oxide fine particle, for example, dispersed in the liquid vehicle. The ink composition may further include a dispersant (for dispersing the semiconductor nanoparticles and/or the metal oxide fine particle). The dispersant may include a carboxylic acid group-containing organic compound (monomer or polymer). The liquid vehicle may not include an (e.g., volatile) organic solvent. The ink composition may be a solvent-free system.

The liquid monomer may include a (photo)polymerizable monomer including a carbon-carbon double bond. The composition may optionally further include a thermal initiator or a photoinitiator. The polymerization of the composition may be initiated by light or heat.

Details of the semiconductor nanoparticle in the composition or in the composite are as described herein. An amount of the semiconductor nanoparticle in the composition or in the composite may be appropriately adjusted taking into consideration a desired end use (for example, a use as a luminescent type color filter). In one or more embodiments, an amount of the semiconductor nanoparticle in the composition (or composite) may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on the solid content of the composition or composite (hereinafter, the solid content may be a solid content of the composition or a solid content of the composite). The amount of the semiconductor nanoparticle may be less than or equal to about 70 wt %, for example, less than or equal to about 65 wt %, less than or equal to about 60 wt %, less than or equal to about 55 wt %, or less than or equal to about 50 wt %, based on the solid content. A weight percentage of a given component with respect to a total solid content in a composition may represent an amount of the given component in the composite as described herein.

In one or more embodiments, an ink composition may be a semiconductor nanoparticle-containing photoresist composition that can be used in a photolithography process. In one or more embodiments, an ink composition may be a semiconductor nanoparticle-containing composition capable of providing a pattern in a printing process (e.g., a droplet discharging method such as an inkjet printing). The composition according to one or more embodiments may not include a conjugated (or conductive) polymer (except for a cardo binder to be described herein). The composition according to one or more embodiments may include a conjugated polymer. In one or more embodiments, the conjugated polymer may include a polymer having a conjugated double bond in the main chain (e.g., polyphenylenevinylene, or the like).

In the composition according to one or more embodiments, the dispersant may ensure dispersibility of the nanoparticles. In one or more embodiments, the dispersant may be a binder (or a binder polymer). The binder may include a carboxylic acid group (e.g., in the repeating unit). The binder may be an insulating polymer. The binder may be a carboxylic acid group-containing compound (monomer or polymer).

In the composition (or the composite), an amount of the dispersant may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total solid content of the composition (or composite). The amount of the dispersant may be less than or equal to about 55 wt %, less than or equal to about 35 wt %, less than or equal to about 33 wt %, or less than or equal to about 30 wt %, based on the total solid content.

In the composition (or the liquid vehicle), a liquid monomer or a polymerizable (e.g., photopolymerizable) monomer (hereinafter, referred to as a monomer) including the carbon-carbon double bond may include a (e.g., photopolymerizable) (meth)acryl-containing monomer. The monomer may be a precursor for an insulating polymer.

An amount of the (photopolymerizable) monomer, based on a total weight of the composition, may be greater than or equal to about 0.5 wt %, for example, greater than or equal to about 1 wt %, greater than or equal to about 2 wt %, greater than or equal to about 3 wt %, greater than or equal to about 5 wt %, or greater than or equal to about 10 wt %. An amount of the (photopolymerizable) monomer, based on the total weight of the composition, may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and contents of the polymerizable monomers. In one or more embodiments, The amount of the initiator may be greater than or equal to about 0.01 wt %, for example, greater than or equal to about 1 wt %, or and/or less than or equal to about 10 wt %, to, for example, less than or equal to about 9 wt %, less than or equal to about 8 wt %, less than or equal to about 7 wt %, less than or equal to about 6 wt %, or less than or equal to about 5 wt %, based on the total weight of the composition (or the total weight of the solid content), but embodiments are not limited thereto.

The composition (or composite) may further include a (poly or monofunctional) thiol compound having at least one thiol group at the terminal end (or a moiety derived therefrom, such as a moiety produced by a reaction between a thiol and a carbon-carbon double bond, for example a sulfide group), metal oxide fine particle, or a combination thereof.

The metal oxide fine particle may include $TiO_2$, $SiO_2$, $BaTiO_3$, $Ba_2TiO_4$, ZnO, or a combination thereof. In the composition (or composite), an amount of the metal oxide may be greater than or equal to about 1 wt %, greater than or equal to about 2 wt %, greater than or equal to about 3 wt %, greater than or equal to about 5 wt %, or greater than or equal to about 10 wt % to less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, less than or equal to about 7 wt %, less than or equal to about 5 wt %, or less than or equal to about 3 wt %, based on the total solid content.

A diameter of the metal oxide fine particle is not particularly limited, and may be appropriately selected. The diameter of the metal oxide fine particle may be greater than or equal to about 100 nm, for example greater than or equal to about 150 nm, or greater than or equal to about 200 nm and less than or equal to about 1000 nm, or less than or equal to about 800 nm.

The polythiol compound may be a dithiol compound, a trithiol compound, a tetrathiol compound, or a combination thereof. For example, the thiol compound may be ethylene glycol bis(3-mercaptopropionate), ethylene glycol dimercapto acetate, trimethylolpropane tris(3-mercaptopropionate), pentaerythritol tetrakis(3-mercaptopropionate), pentaerythritol tetrakis(2-mercaptoacetate), 1,6-hexane dithiol, 1,3-propane dithiol, 1,2-ethane dithiol, polyethylene glycol dithiol including 1 to 10 ethylene glycol repeating units, or a combination thereof.

An amount of the thiol compound (or moieties derived therefrom) may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on the total solid content. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 18 wt %, or greater than or equal to about 20 wt %, based on the total solid content.

The composition or the liquid vehicle may include an organic solvent. The composition or the liquid vehicle may not include an organic solvent. If present, the type of solvent that may be used is not particularly limited. The type and amount of the organic solvent is appropriately determined in consideration of the types and amounts of the aforementioned main components (i.e., nanoparticles, dispersants, polymerizable monomers, initiators, thiol compounds, or the like, if present) and other additives to be described herein. The composition may include a solvent in a residual amount except for a desired content of the (non-volatile) solid. In one or more embodiments, examples of the organic solvent may be an ethylene glycol solvent such as ethylene glycol, diethylene glycol, polyethylene glycol, and the like; a glycol ether solvent such as ethylene glycol monomethyl ether, ethylene glycol monoethyl ether, diethylene glycol monomethyl ether, ethylene glycol diethyl ether, diethylene glycol dimethyl ether, or the like; a glycol ether acetate solvent such as ethylene glycol acetate, ethylene glycol monomethylether acetate, diethylene glycol monomethylether acetate, diethylene glycol monobutylether acetate, or the like; a propylene glycol solvent such as propylene glycol, or the like; a propylene glycol ether solvent such as propylene glycol monomethyl ether, propylene glycol monoethyl ether, propylene glycol monopropyl ether, propylene glycol monobutyl ether, propylene glycol dimethylether, dipropylene glycol dimethyl ether, propylene glycol diethyl ether, dipropylene glycol diethyl ether, or the like; a propylene glycol ether acetate solvent such as propylene glycol monomethyl ether acetate, dipropylene glycol monoethyl ether acetate, or the like; an amide solvent such as N-methylpyrrolidone, dimethyl formamide, dimethyl acetamide, or the like; a ketone solvent such as methylethylketone (MEK), methylisobutylketone (MIBK), cyclohexanone, or the like; a petroleum solvent such as toluene, xylene, solvent naphtha, and the like; an ester solvent such as ethyl acetate, butyl acetate, ethyl lactate, ethyl 3-ethoxy propionate, or the like; an ether solvent such as diethyl ether, dipropyl ether, dibutyl ether, or the like; chloroform; a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon; or a combination thereof.

In addition to the aforementioned components, the composition (or composite) of one or more embodiments may further include an additive such as a light diffusing agent, a leveling agent, a coupling agent, or a combination thereof. Components (binder, monomer, solvent, additives, thiol compound, cardo binder, or the like) included in the composition of one or more embodiments may be appropriately selected, and for specific details thereof, for example, US-2017-0052444-A1 may be referred to, the entire contents of which are incorporated herein by reference.

The composition according to one or more embodiments may be prepared by a method that includes preparing a nanoparticle dispersion including the semiconductor nanoparticle of one or more embodiments, the dispersant, and a solvent; and mixing the nanoparticle dispersion with an initiator, a polymerizable monomer (e.g., a (meth)acryl-containing monomer), optionally a thiol compound, optionally a metal oxide fine particle, and optionally the additive. Each of the aforementioned components may be mixed sequentially or simultaneously, and the mixing order is not particularly limited.

The composition may provide a color conversion layer (or a patterned film of the composite) by (e.g., radical) polymerization. The color conversion layer (or the patterned film of the composite) may be produced using a photoresist composition. As provided in FIG. 2A, this method may include forming a film of the aforementioned composition on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a quantum dot-polymer composite (S4). Optionally, the method may further include the step of post-bake (S5).

Figure 2:
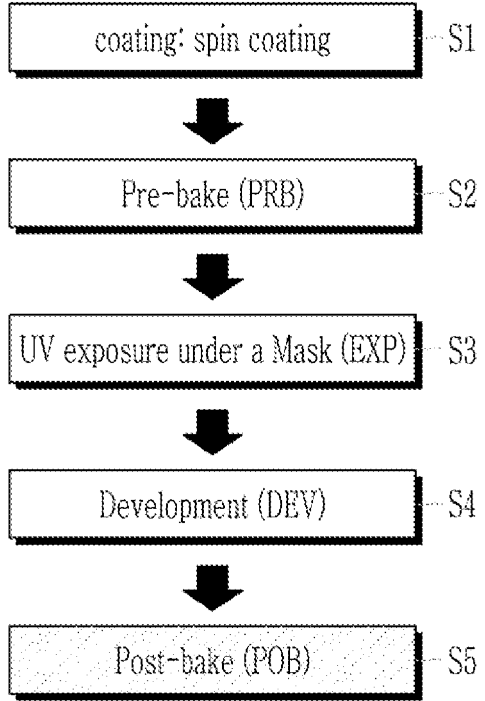
FIG. 2A is a sequence of steps showing pattern formation process (photolithography method) using the ink composition of one or more embodiments.
FIG. 2B is a sequence of steps showing a pattern forming process (inkjet method) using the ink composition of one or more embodiments.
Figure 2:
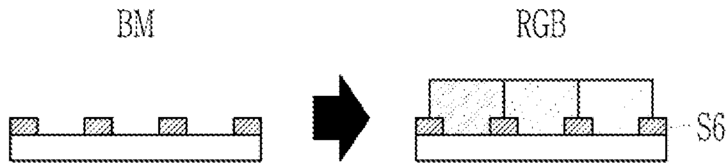

Referring to FIG. 2A, the composition of one or more embodiments may be applied to a predetermined thickness on a substrate using an appropriate method such as spin coating or slit coating to form a film. The formed film may be optionally subjected to a pre-baking (PRB) step. The pre-baking may be performed by selecting an appropriate condition from known conditions of a temperature, time, an atmosphere, or the like.

The formed (and optionally prebaked) film may be exposed to light having a predetermined wavelength under a mask having a predetermined pattern. A wavelength and intensity of the light may be selected considering types and contents of the photoinitiator, types and contents of the quantum dots, or the like.

The exposed film may be treated with an alkali developing solution (e.g., dipping or spraying) to dissolve an unexposed region and obtain a desired pattern. The obtained pattern may be, optionally, post-baked (POB) to improve crack resistance and solvent resistance of the pattern, for example, at a temperature of about 150° C. to about 230° C. for a predetermined time (e.g., greater than or equal to about 10 minutes, or greater than or equal to about 20 minutes).

When the color conversion layer or the patterned film of the nanoparticle composite has a plurality of repeating sections (that is, color conversion regions), each repeating section may be formed by preparing a plurality of compositions including quantum dots (e.g., red light emitting quantum dots, green quantum dots, or optionally, blue light emitting quantum dots) having desired luminous properties (photoluminescence peak wavelength or the like) and repeating the aforementioned pattern-forming process as many times as necessary (e.g., 2 times or more, or 3 times or more) for each composition, resultantly obtaining a nanoparticle-polymer composite having a desired pattern (S6). For example, the nanoparticle-polymer composite may have a pattern of at least two repeating color sections (e.g., RGB color sections). This nanoparticle-polymer composite pattern may be used as a photoluminescence type color filter in a display device.

Figure 2B:
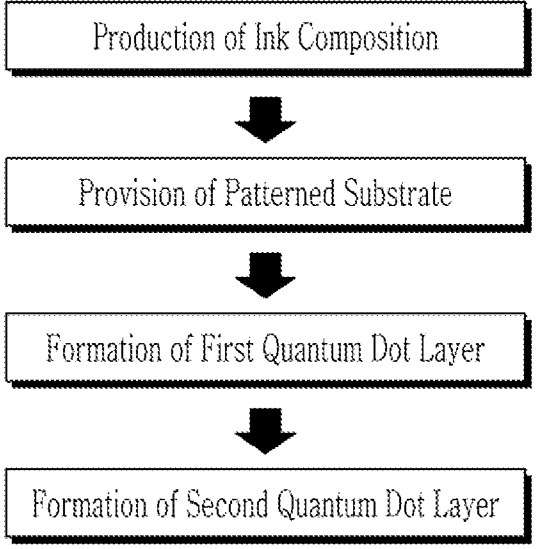

The color conversion layer or patterned film of the nanoparticle composite may be produced using an ink composition configured to form a pattern in an inkjet manner. Referring to FIG. 2B, such a method may include preparing an ink composition according to one or more embodiments, providing a substrate (e.g., with pixel areas patterned by electrodes and optionally banks or trench type partition walls, or the like), and depositing an ink composition on the substrate (or the pixel area) to form, for example, a first composite layer (or first region). The method may include depositing an ink composition on the substrate (or the pixel area) to form, for example, a second composite layer (or second region). The forming of the first composite layer and forming of the second composite layer may be simultaneously or sequentially carried out.

The depositing of the ink composition may be performed using an appropriate liquid crystal discharger, for example, an inkjet or nozzle printing system (having an ink storage and at least one print head). The deposited ink composition may provide a (first or second) composite layer through the solvent removal and polymerization by the heating. The method may provide a highly precise nanoparticle-polymer composite film or patterned film for a short time by the simple method.

In the nanoparticle-polymer composite (e.g., a first composite) of one or more embodiments, the (polymer) matrix may include the components described herein with respect to the composition. In the composite, an amount of the matrix, based on a total weight of the composite, may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %. The amount of the matrix may be, based on a total weight of the composite, less than or equal to about 95 wt %, less than or equal to about 90 wt %, less than or equal to about 80 wt %, less than or equal to about 70 wt %, less than or equal to about 60 wt %, or less than or equal to about 50 wt %.

The (polymer) matrix may include at least one of a dispersant (e.g., a carboxylic acid group-containing binder polymer), a polymerization product (e.g., an insulating polymer) of a polymerizable monomer including (at least one, for example, at least two, at least three, at least four, or at least five) carbon-carbon double bonds, and a polymerization product of the polymerizable monomer and a polythiol compound having at least two thiol groups at a terminal end. The matrix may include a linear polymer, a crosslinked polymer, or a combination thereof. The (polymer) matrix may not include a conjugated polymer (excluding cardo resin). The matrix may include a conjugated polymer.

The crosslinked polymer may include a thiol-ene resin, a crosslinked poly(meth)acrylate, a crosslinked polyurethane, a crosslinked epoxy resin, a crosslinked vinyl polymer, a crosslinked silicone resin, or a combination thereof. In one or more embodiments, the crosslinked polymer may be a polymerization product of the aforementioned polymerizable monomers and optionally a polythiol compound.

The linear polymer may include a repeating unit derived from a carbon-carbon unsaturated bond (e.g., a carbon-carbon double bond). The repeating unit may include a carboxylic acid group. The linear polymer may include an ethylene repeating unit.

The carboxylic acid group-containing repeating unit may include a unit derived from a monomer including a carboxylic acid group and a carbon-carbon double bond, a unit derived from a monomer having a dianhydride moiety, or a combination thereof.

The (polymer) matrix may include a carboxylic acid group-containing compound (e.g., a binder, a binder polymer, or a dispersant) (e.g., for dispersion of nanoparticles or a binder).

The first composite (or film or pattern thereof) may have, for example, a thickness of less than or equal to about 25 μm, less than or equal to about 20 μm, less than or equal to about 15 μm, less than or equal to about 10 μm, less than or equal to about 8 μm, or less than or equal to about 7 μm to greater than about 2 μm, for example, greater than or equal to about 3 μm, greater than or equal to about 3.5 μm, greater than or equal to about 4 μm, greater than or equal to about 5 μm, greater than or equal to about 6 μm, greater than or equal to about 7 μm, greater than or equal to about 8 μm, greater than or equal to about 9 μm, or greater than or equal to about 10 μm.

The semiconductor nanoparticle, the composite (or the pattern thereof) including the semiconductor nanoparticle, or the color conversion panel including the same may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dot may be included in an electronic apparatus. Such an electronic apparatus may include, but is not limited to, a portable terminal device, a monitor, a notebook PC, a television, an electric sign board, a camera, a car, or the like, but embodiments are not limited thereto. The electronic apparatus may be a portable terminal device, a monitor, a note PC, or a television, including a display device (or a light emitting device) including quantum dots. The electronic apparatus may be a camera or a mobile terminal device including an image sensor including quantum dots. The electronic apparatus may be a camera or a vehicle including a photodetector including quantum dots.

In one or more embodiments, the electronic device or the display device (e.g., display panel) may further include a color conversion layer (or a color conversion panel) and optionally, a light source. The light source may be configured to provide incident light to the color conversion layer or the color conversion panel. In one or more embodiments, the display panel may include a light emitting panel (or a light source), the aforementioned color conversion panel, a light transmitting layer located between the aforementioned light emitting panel and the aforementioned color conversion panel. The color conversion panel includes a substrate, and the color conversion layer may be disposed on the substrate. (see FIGS. 3A and 4)

When present, the light source or the light emitting panel may be configured to provide an incident light to the color conversion layer or the color conversion panel. The incident light may have a maximum emission wavelength of greater than or equal to about 440 nm, for example, greater than or equal to about 450 nm to less than or equal to about 580 nm, for example, less than or equal to about 480 nm, less than or equal to about 470 nm, or less than or equal to about 460 nm.

In one or more embodiments, the electronic device (e.g., a photoluminescent device) may further include a sheet of the nanoparticle composite. Referring to FIG. 3B, the device 400 may include a backlight unit 410 and a liquid crystal panel 420, wherein the backlight unit 410 may include a quantum dot polymer composite sheet (QD sheet). Specifically, the backlight unit 410 may have a structure that a reflector, a light guide plate (LGP), a light source (a blue LED or the like), the quantum dot polymer composite sheet (QD sheet), and an optical film (a prism, a double brightness enhance film (DBEF, or the like) are stacked. The liquid crystal panel 420 may be disposed on the backlight unit 410 and have a structure where a thin film transistor (TFT), liquid crystals (LC), and a color filter (color filter) are included between two polarizers (Pol). The quantum dot polymer composite sheet (QD sheet) may include semiconductor nanoparticles (e.g., quantum dots) emitting a red light and a green light after absorbing light from the light source. Blue light provided from the light source may be combined with the red light and the green light emitted from the semiconductor nanoparticles, while passing the quantum dot polymer composite sheet, and converted into a white light. This white light may be separated into a blue light, a green light, and a red light by a color filter in the liquid crystal panel, and then emitted to the outside for each pixel.

The color conversion panel may include a substrate, and the color conversion layer may be disposed on the substrate. The color conversion layer or the color conversion panel may include a patterned film of the nanoparticle composite. The patterned film may include a repeating section that is configured to emit a light of a desired wavelength. The repeating section may include a second region. The second region may be a red light-emitting section. The repeating section may include a first region. The first region may be a green light-emitting section. The repeating section may include a third region. The third region may include a section that emits or transmits a blue light. Details of the first, second, and third regions are as described herein.

The light emitting panel or the light source may be an element emitting an incident light (e.g., an excitation light). The incident light may include a blue light and optionally, a green light. The light source may include an LED. The light source may include an organic LED (OLED). The light source may include a micro LED. On the front surface (light emitting surface) of the first region and the second region, an optical element to block (e.g., reflect or absorb) a blue light (and optionally a green light) for example, a blue light (and optionally a green light) blocking layer or a first optical filter that will be described herein may be disposed. In one or more embodiments, the light source may include an organic light emitting diode to emit a blue light and an organic light emitting diode to emit a green light, a green light removing filter may be further disposed on a third region through which the blue light is transmitted.

The light emitting panel or the light source may include a plurality of light emitting units respectively corresponding to the first region and the second region, and the light emitting units may include a first electrode and a second electrode facing each other and an (organic) electroluminescent layer located between the first electrode and the second electrode. The electroluminescent layer may include an organic light emitting material. For example, each light emitting unit of the light source may include an electroluminescent device (e.g., an organic light emitting diode (OLED)) structured to emit a light of a predetermined wavelength (e.g., a blue light, a green light, or a combination thereof). Structures and materials of the electroluminescent device and the organic light emitting diode (OLED) are not particularly limited.

Hereinafter, the display panel and the color conversion panel will be described in further detail with reference to the drawings.

Figure 3A:
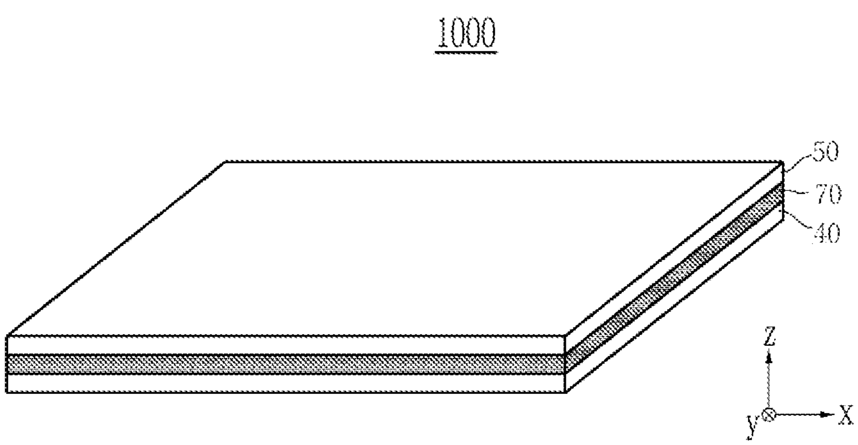
FIG. 3A is a perspective view illustrating an example of a display panel including a color conversion panel according to one or more embodiments.
Figure 3B:
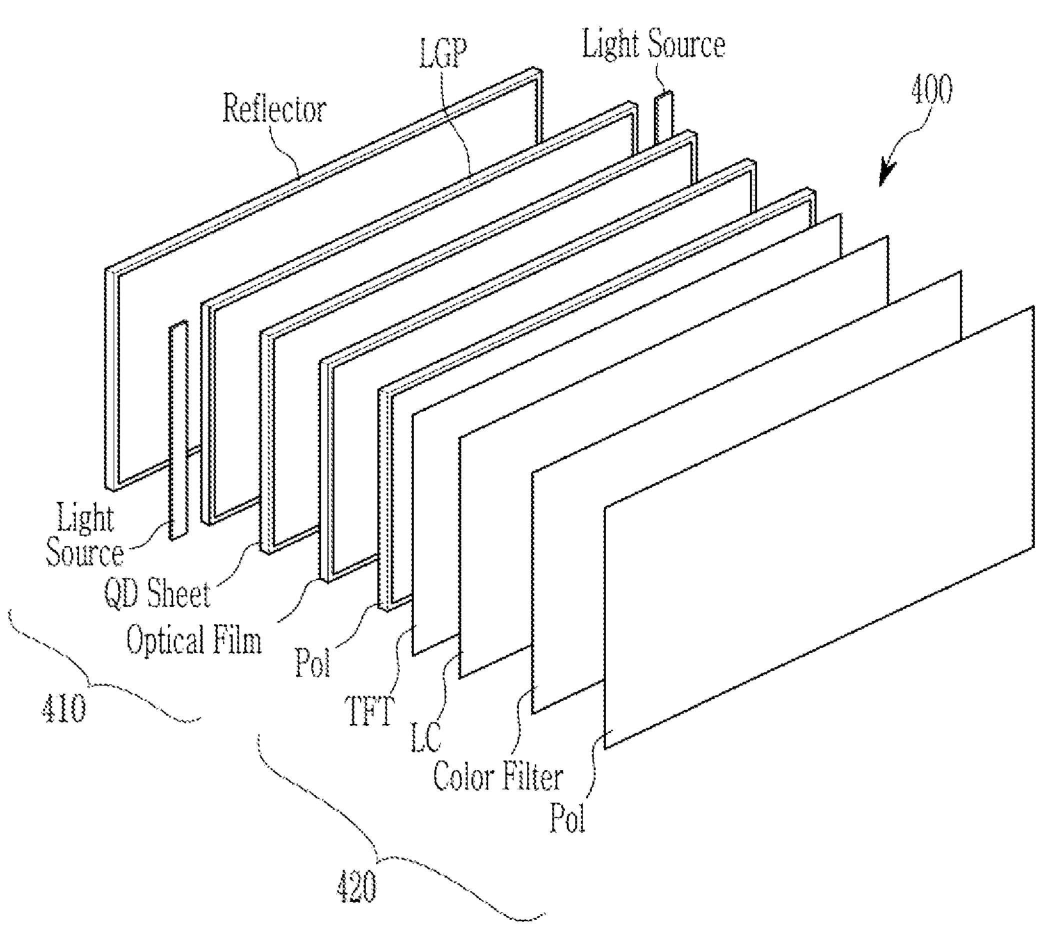
FIG. 3B is an exploded view of a display device according to one or more embodiments.

FIG. 3A is a perspective view of one or more embodiments of a display panel constructed as described herein.

Figure 4:
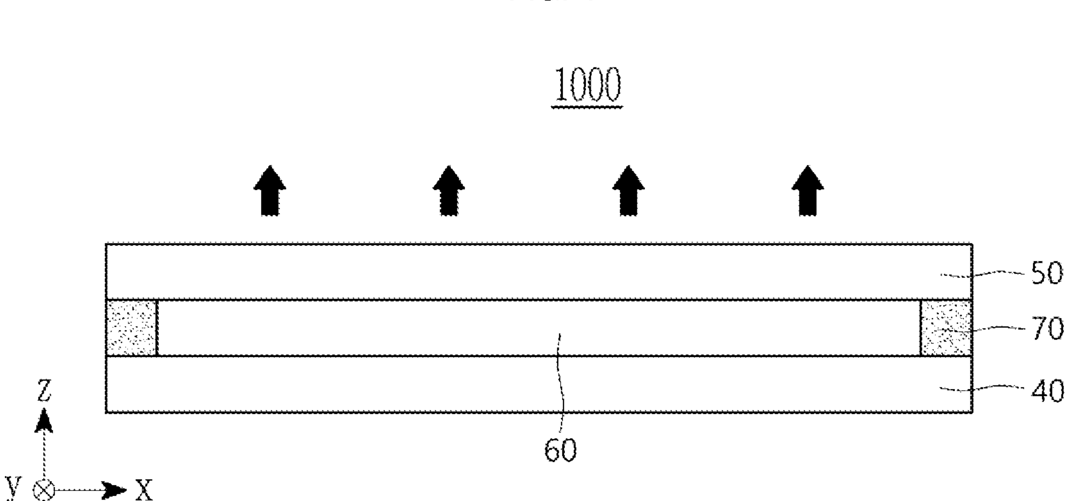
FIG. 4 is a cross-sectional view of the display panel of FIG. 3A.

FIG. 4 is a cross-sectional view of the display panel of FIG. 3A. Referring to FIGS. 3A and 4, the display panel 1000 according to one or more embodiments includes a light emitting panel 40 and a color conversion panel 50. The display panel or the electronic device may further include a light transmitting layer 60 disposed between the light emitting panel 40 and the color conversion panel 50, and a binding material 70 binding the light emitting panel 40 and the color conversion panel 50. The light transmitting layer may include a passivation layer, a filling material, an encapsulation layer, or a combination thereof (not shown). A material for the light transmitting layer may be appropriately selected without particular limitation. The material for the light transmitting layer may be an inorganic material, an organic material, an organic/inorganic hybrid material, or a combination thereof.

The light emitting panel 40 and the color conversion panel 50 each have a surface opposite the other, i.e., the two respective panels face each other, with the light transmitting layer (or the light transmitting panel) 60 disposed between the two panels. The color conversion panel 50 is disposed in a direction such that for example, light emitting from the light emitting panel 40 irradiates the light transmitting layer 60. The binding material 70 may be disposed along edges of the light emitting panel 40 and the color conversion panel 50, and may be, for example, a sealing material.

Figure 5A:
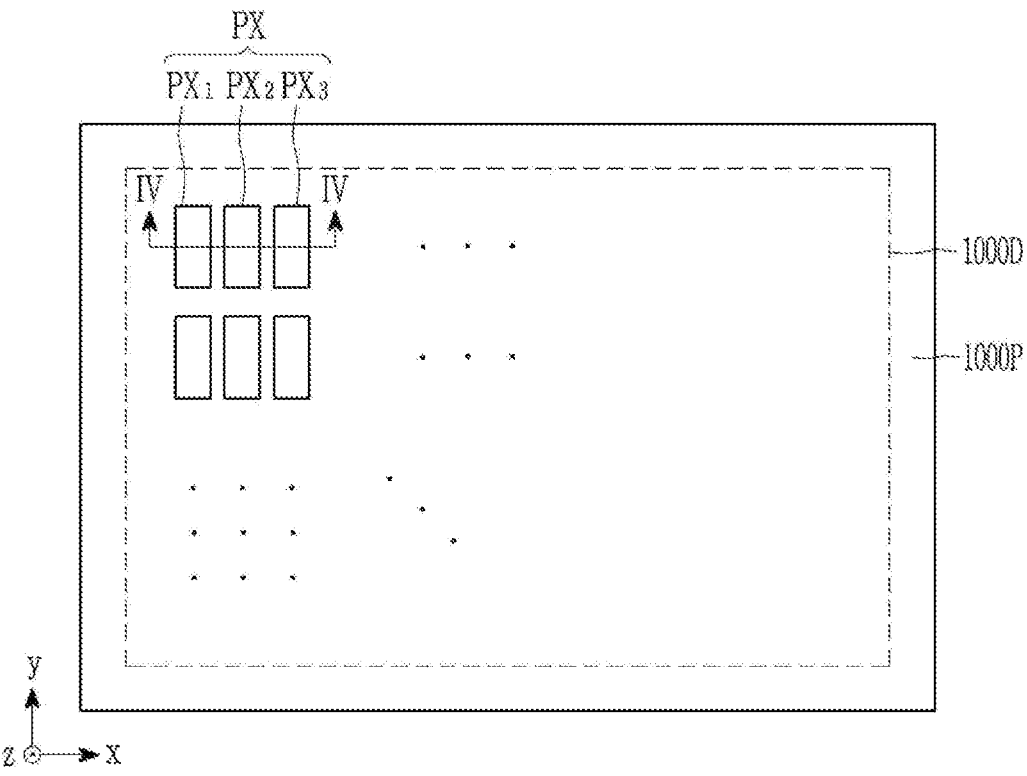
FIG. 5A is a plan view illustrating an example of a pixel arrangement of the display panel of FIG. 3A.

FIG. 5A is a plan view of one or more embodiments of a pixel arrangement of a display panel of one or more embodiments. Referring to FIG. 5A, the display panel 1000 includes a display area 1000D displaying an image and a non-display area 1000P positioned in a peripheral area of the display area 1000D and disposed with a binding material.

The display area 1000D includes a plurality of pixels PX arranged along with a row (e.g., an x direction), column (e.g., a y direction), and each representative pixel PX may include a plurality of sub-pixels $PX_1$, $PX_2$, and $PX_3$ expressing (e.g., displaying) different colors from each other. One or more embodiments is exemplified with a structure in which three sub-pixels $PX_1$, $PX_2$, and $PX_3$ are configured to provide a pixel. One or more embodiments may further include an additional sub-pixel such as a white sub-pixel and may further include at least one sub-pixel expressing (e.g., displaying) the same color. The plurality of pixels PX may be aligned, for example, in a Bayer matrix, a matrix sold under the trade designation PenTile, a diamond matrix, or the like, or a combination thereof.

The sub-pixels $PX_1$, $PX_2$, and $PX_3$ may express, e.g., display, three primary colors or a color of a combination of three primary colors, for example, may express, e.g., display, a color of red, green, blue, or a combination thereof. For example, the first sub-pixel $PX_1$ may express, e.g., display, a red color, and the second sub-pixel $PX_2$ may express, e.g., display, a green color, and the third sub-pixel $PX_3$ may express, e.g., display, a blue color.

In the drawing, all sub-pixels are exemplified to have the same size, but embodiments are not limited thereto, and at least one of the sub-pixels may be larger or smaller than other sub-pixels. In the drawings, all sub-pixels are exemplified to have the same shape, but it is not limited thereto and at least one of the sub-pixels may have different shape from other sub-pixels.

In the display panel or electronic device according to the embodiment, the light emitting panel may include a substrate and a TFT (e.g., oxide-containing) disposed on the substrate. A light emitting device (e.g., having a tandem structure) may be disposed on the TFT.

The light emitting device may include a light emitting layer (e.g., a blue light emitting layer, a green light emitting layer, or a combination thereof) located between the first electrode and the second electrode facing each other. A charge generation layer may be disposed between each of the light emitting layers. Each of the first electrode and the second electrode may be patterned with a plurality of electrode elements to correspond to the pixel. The first electrode may be an anode or a cathode. The second electrode may be a cathode or an anode.

The light emitting device may include an organic LED, a nanorod LED, a mini LED, a micro LED, or a combination thereof. In an embodiment, "a mini LED" may have a size of greater than or equal to about 100 micrometers, greater than or equal to about 150 micrometers, greater than or equal to about 200 micrometers and less than or equal to about 1 millimeter, less than or equal to about 0.5 millimeters, less than or equal to about 0.15 millimeters, or less than or equal to about 0.12 millimeters, but is not limited thereto. In an embodiment, "a micro LED" may have a size of less than about 100 micrometers, less than or equal to about 50 micrometers, or less than or equal to about 10 micrometers. The size of the micro LED may be greater than or equal to about 0.1 micrometers, greater than or equal to about 0.5 micrometers, greater than or equal to about 1 micrometer, or greater than or equal to about 5 micrometers, but is not limited thereto.

FIGS. 5B to 5E are cross-sectional views showing examples of light emitting devices, respectively.

Figure 5B:
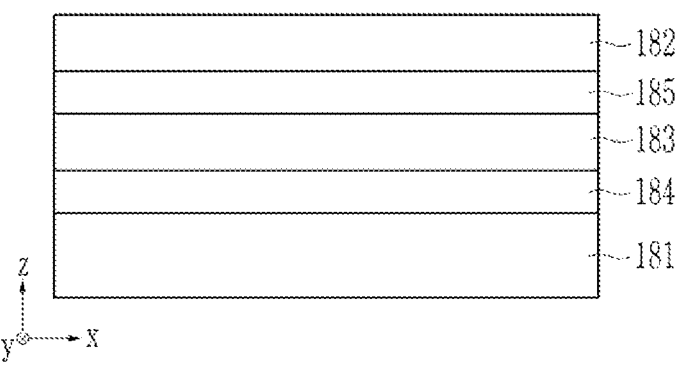
FIGS. 5B, 5C, 5D, and 5E are cross-sectional views showing examples of light emitting devices according to one or more embodiments.

Referring to FIG. 5B, the light emitting device 180 may include a first electrode 181 and a second electrode 182 facing each other; a light emitting layer 183 located between the first electrode 181 and the second electrode 182; and optionally auxiliary layers 184 and 185 located between the first electrode 181 and the light emitting layer 183, and between the second electrode 182 and the light emitting layer 183, respectively.

The first electrode 181 and the second electrode 182 may be disposed to face each other along a thickness direction (for example, a z direction), and any one of the first electrode 181 and the second electrode 182 may be an anode and the other may be a cathode. The first electrode 181 may be a light transmitting electrode, a semi-transparent electrode, or a reflective electrode, and the second electrode 182 may be a light transmitting electrode or a semi-transparent electrode. The light transmitting electrode or semi-transparent electrode may be, for example, made of a thin single layer or multiple layers of metal thin film including conductive oxides such as indium tin oxide (ITO), indium zinc oxide (IZO), zinc oxide (ZnO), tin oxide (SnO), aluminum tin oxide (AlTO), fluorine-doped tin oxide (FTO), or the like; or silver (Ag), copper (Cu), aluminum (Al), magnesium (Mg), magnesium-silver (Mg—Ag), magnesium-aluminum (Mg—Al), or a combination thereof. The reflective electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but embodiments are not limited thereto.

The light emitting layer(s) 183 may include a first light emitting body emitting light with a blue emission spectrum, a second light emitting body emitting light with a green emission spectrum, or a combination thereof.

The blue emission spectrum may have a maximum emission wavelength in a wavelength region of greater than or equal to about 400 nm to less than about 500 nm, and, within the range, in a wavelength region of about 410 nm to about 490 nm, about 420 nm to about 480 nm, about 430 nm to about 470 nm, about 440 nm to about 465 nm, about 445 nm to about 460 nm, or about 450 nm to about 458 nm.

The green emission spectrum may have a maximum emission wavelength in a wavelength region of greater than or equal to about 500 nm to less than about 590 nm, and, within the range, in a wavelength region of about 510 nm to about 580 nm, about 515 nm to about 570 nm, about 520 nm to about 560 nm, about 525 nm to about 555 nm, about 530 nm to about 550 nm, about 535 nm to about 545 nm, or a combination thereof.

In one or more embodiments, the light emitting layer 183 or the light emitting body included therein may include a phosphorescent material, a fluorescent material, or a combination thereof. In one or more embodiments, the light emitting body may include an organic light emitting body, wherein the organic light emitting body may be a low molecular compound, a polymer compound, or a combination thereof. Specific types of the phosphorescent material and the fluorescent material are not particularly limited, but may be appropriately selected from known materials. In one or more embodiments, the light emitting body may include an inorganic light emitting body, and the inorganic light emitting body may be an inorganic semiconductor, a quantum dot, a perovskite, or a combination thereof. The inorganic semiconductor may include a metal nitride, a metal oxide, or a combination thereof. The metal nitride, the metal oxide, or the combination thereof may include a Group III metal such as aluminum, gallium, indium, thallium, a Group IV metal such as silicon, germanium, tin, or a combination thereof. In one or more embodiments, the light emitting body may include an inorganic light emitting body, and the light emitting device 180 may be a quantum dot light emitting diode, a perovskite light emitting diode, or a micro light emitting diode (μLED). Materials usable as the inorganic light emitting body may be selected appropriately.

In one or more embodiments, the light emitting device 180 may further include auxiliary layers 184 and 185. The auxiliary layers 184 and 185 may be disposed between a first electrode 181 and a light emitting layer 183, and/or between a second electrode 182 and a light emitting layer 183, respectively. The auxiliary layers 184 and 185 may be charge auxiliary layers for controlling injection and/or mobility of charges. The auxiliary layers 184 and 185 may include at least one layer or two layers, respectively, and for example, may include a hole injection layer, a hole transport layer, an electron blocking layer, an electron injection layer, an electron transport layer, a hole blocking layer, or a combination thereof. At least one of the auxiliary layers 184 and 185 may be omitted, if desired. The auxiliary layers 184 and 185 may be formed of a material appropriately selected from materials known for an organic electroluminescent device or the like.

The light emitting devices 180 disposed in each of the subpixels $PX_1$, $PX_2$, and $PX_3$ may be the same or different from each other. The light emitting devices 180 in each of the subpixels $PX_1$, $PX_2$, and $PX_3$ may emit a light having the same or different emission spectra. The light emitting devices 180 in each of the subpixels $PX_1$, $PX_2$, and $PX_3$ may emit, for example, light having a blue emission spectrum, light having a green emission spectrum, or a combination thereof. The light emitting devices 180 in each of the subpixels $PX_1$, $PX_2$, and $PX_3$ may be separated by a pixel defining layer (not shown).

Figure 5C:
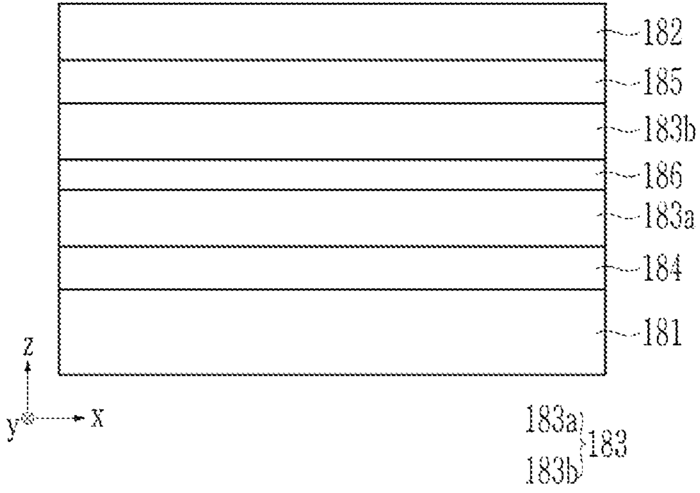

Referring to FIG. 5C, the light emitting device 180 may be a light emitting device having a tandem structure, and includes a first electrode 181 and a second electrode 182 facing each other; a first light emitting layer 183*a* and a second light emitting layer 183*b* located between the first electrode 181 and the second electrode 182; a charge generation layer 186 located between the first light emitting layer 183*a* and the second light emitting layer 183*b*, and optionally auxiliary layers 184 and 185 located between the first electrode 181 and the first light emitting layer 183*a*, and/or between the second electrode 182 and the second light emitting layer 183*b*, respectively.

Details of the first electrode 181, the second electrode 182, and the auxiliary layers 184 and 185 are as described herein.

The first light emitting layer 183*a* and the second light emitting layer 183*b* may emit a light having the same or different emission spectra. In one or more embodiments, the first light emitting layer 183*a* or the second light emitting layer 183*b* may emit light having a blue emission spectrum or light having a green emission spectrum, respectively. The charge generation layer 186 may inject an electric charge into the first light emitting layer 183*a* and/or the second light emitting layer 183*b*, and may control a charge balance between the first light emitting layer 183*a* and the second light emitting layer 183*b*. The charge generation layer 186 may include, for example, an n-type layer and a p-type layer, and may include, for example, an electron transport material and/or a hole transport material including an n-type dopant and/or a p-type dopant. The charge generation layer 186 may include one layer or two or more layers.

Figure 5D:
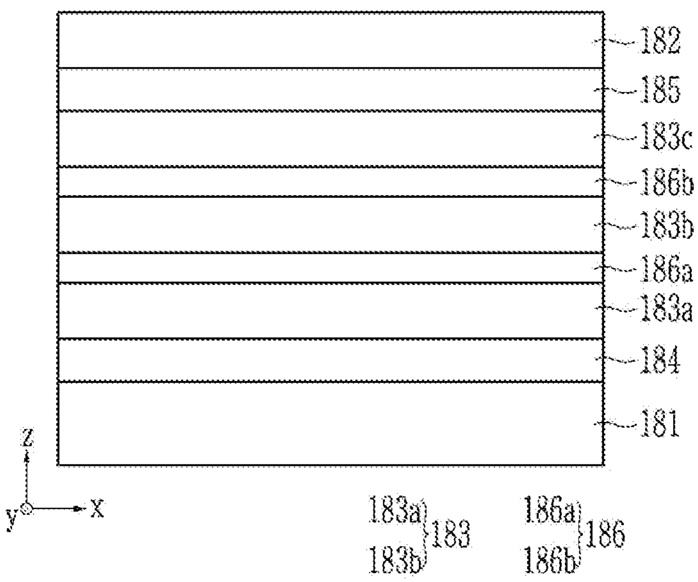

Referring to FIG. 5D, a light emitting device (having a tandem structure) may include a first electrode 181 and a second electrode 182 facing each other; a first light emitting layer 183*a*, a second light emitting layer 183*b*, and a third light emitting layer 183*c* located between the first electrode 181 and the second electrode 182; a first charge generation layer 186*a* located between the first light emitting layer 183*a* and the second light emitting layer 183*b*; a second charge generation layer 186*b* located between the second light emitting layer 183*b* and the third light emitting layer 183*c*; and optionally, auxiliary layers 184 and 185 located between the first electrode 181 and the first light emitting layer 183*a*, and/or located between the second electrode 182 and the third light emitting layer 183*c*, respectively.

Details of the first electrode 181, the second electrode 182, and the auxiliary layers 184 and 185 are as described herein.

The first light emitting layer 183*a*, the second light emitting layer 183*b*, and the third light emitting layer 183*c* may emit a light having the same or different emission spectra. The first light emitting layer 183*a*, the second light emitting layer 183*b*, and the third light emitting layer 183*c* may emit a blue light. In one or more embodiments, the first light emitting layer 183*a* and the third light emitting layer 183*c* may emit light of a blue emission spectrum, and the second light emitting layer 183*b* may emit light of a green emission spectrum. In another embodiment, the first light emitting layer 183*a* and the third light emitting layer 183*c* may emit light of a green emission spectrum, and the second light emitting layer 183*b* may emit light of a blue emission spectrum.

The first charge generation layer 186*a* may inject an electric charge into the first light emitting layer 183*a* and/or the second light emitting layer 183*b*, and may control charge balances between the first light emitting layer 183*a* and the second light emitting layer 183*b*. The second charge generation layer 186*b* may inject an electric charge into the second light emitting layer 183*b* and/or the third light emitting layer 183*c*, and may control charge balances between the second light emitting layer 183*b* and the third light emitting layer 183*c*. Each of the first and second charge generation layers 186*a* and 186*b* may include one layer or two or more layers, respectively.

Figure 5E:
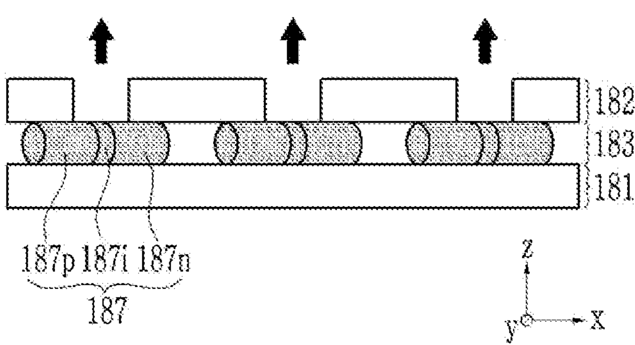

Referring to FIG. 5E, in one or more embodiments, the light emitting device 180 includes a light emitting layer 183, a first electrode 181, a second electrode 182, and a plurality of nanostructures 187 arranged in the light emitting layer 183.

One of the first electrode 181 and the second electrode 182 may be an anode and the other may be a cathode. The first electrode 181 and the second electrode 182 may be an electrode patterned according to a direction of an arrangement of the plurality of nanostructures 187, and may include, for example, a conductive oxide such as indium tin oxide (ITO), indium zinc oxide (IZO), zinc oxide (ZnO), tin oxide (SnO), aluminum tin oxide (AlTO), a fluorine-doped tin oxide (FTO), or the like; or silver (Ag), copper (Cu), aluminum (A1), gold (Au), titanium (Ti), chromium (Cr), nickel (Ni), an alloy thereof, a nitride thereof (e.g., TiN); or a combination thereof, but embodiments are not limited thereto.

The light emitting layer 183 may include a plurality of nanostructures 187, and each of the subpixels $PX_1$, $PX_2$, and $PX_3$ may include a plurality of nanostructures 187. In one or more embodiments, the plurality of nanostructures 187 may be arranged in one direction, but the present disclosure is not limited thereto. The nanostructures 187 may be a compound-containing semiconductor that is configured to emit light of a predetermined wavelength for example with an application of an electric current, and may be, for example, a linear nanostructure such as a nanorod or a nanoneedle.

A diameter or a long diameter of the nanostructures 187 may be, for example, several to several hundreds of nanometers, and aspect ratios of the nanostructures 187 may be greater than about 1, greater than or equal to about 1.5, greater than or equal to about 2.0, greater than or equal to about 3.0, greater than or equal to about 4.0, greater than or equal to about 4.5, greater than or equal to about 5.0, or greater than about 1 to less than or equal to about 20, about 1.5 to about 20, about 2.0 to about 20, about 3.0 to about 20, about 4.0 to about 20, about 4.5 to about 20, or about 5.0 to about 20.

Each of the nanostructures 187 may include a p-type region 187*p*, an n-type region 187*n*, and a multiple quantum well region 187*i*, and may be configured to emit light from the multiple quantum well region 187*i*. The nanostructure 187 may include, for example, gallium nitride (GaN), indium gallium nitride (InGaN), aluminum gallium nitride (AlGaN), or a combination thereof, and may have, for example, a core-shell structure.

The plurality of nanostructures 187 may each emit a light having the same or different emission spectra. In one or more embodiments, the nanostructure may emit light of a blue emission spectrum, for example, light of a blue emission spectrum having a maximum emission wavelength in a wavelength region of greater than or equal to about 400 nm to less than 500 nm, about 410 nm to about 490 nm, or about 420 nm to about 480 nm.

Figure 6:
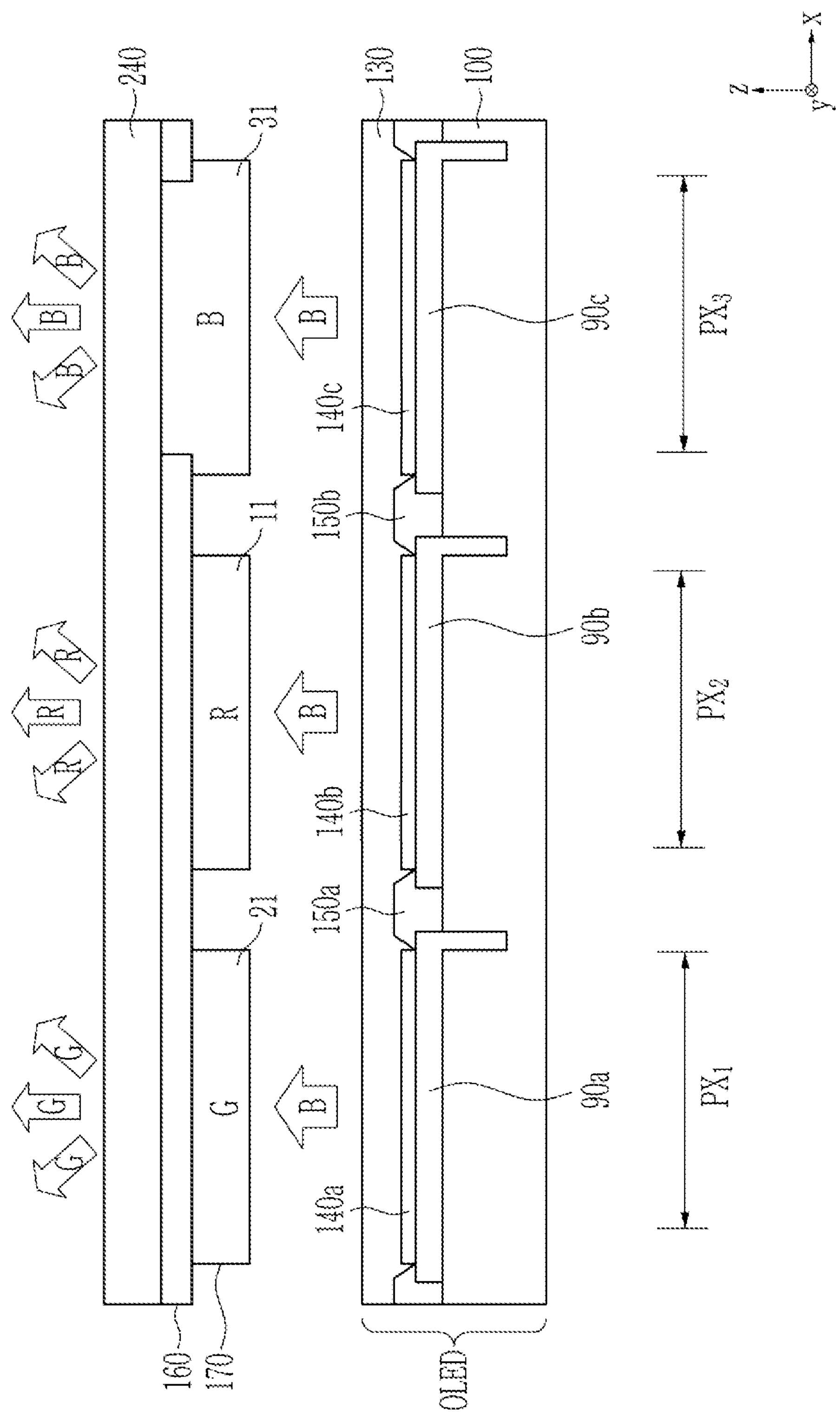
FIG. 6 is a cross-sectional view of the display panel of FIG. 5A taken along line IV-IV.

FIG. 6 is a schematic cross-sectional view of a device (or a display panel) according to embodiments. Referring to FIG. 6, the light source (or the light emitting panel) may include an organic light emitting diode that emits a blue light (B) (and, optionally a green light (G)). The organic light emitting diode (OLED) may include at least two pixel electrodes 90*a*, 90*b*, 90*c* formed on the substrate 100, a pixel defines layer 150*a*, 150*b* formed between the adjacent pixel electrodes 90*a*, 90*b*, 90*c*, an organic light emitting layer 140*a*, 140*b*, 140*c* formed on each pixel electrode 90*a*, 90*b*, 90*c*, and a common electrode layer 130 formed on the organic light emitting layer 140*a*, 140*b*, 140*c*. A thin film transistor (TFT) and a substrate may be disposed under the organic light emitting diode (OLED), which are not shown. Pixel areas of the OLED may be disposed corresponding to the first, second, and third regions as described herein. In one or more embodiments, the color conversion panel and the light emitting panel may be separated as shown in FIG. 6. In one or more embodiments, the color conversion panel may be stacked directly on the light emitting panel.

A laminated structure including the luminescent nanostructure composite pattern 170 (e.g., a first region 11 or R including red light emitting luminescent nanostructures, a second region 21 or G including green light emitting luminescent nanostructures, and a third region 31 or B including or not including a luminescent nanostructure, e.g., a blue light emitting luminescent nanostructure) and substrate 240 may be disposed on the light source. The blue light emitted from the light source enters the first region and second region and may emit a red light and a green light, respectively. The blue light emitted from the light source may pass through the third region. An element (first optical filter 160 or excitation light blocking layer) configured to block the excitation light may be disposed between the luminescent nanostructure composite layers R and G and the substrate, if desired. In one or more embodiments, the excitation light includes a blue light and a green light, and a green light blocking filter (not shown) may be added to the third region. The first optical filter or the excitation light blocking layer will be described in more detail herein.

Such a (display) device may be produced by separately producing the aforementioned laminated structure and LED or OLED (e.g., emitting a blue light) and then combining the laminated structure and LED or OLED. The (display) device may be produced by directly forming the luminescent nanostructure composite pattern on the LED or OLED.

In the color conversion panel or a display device, a substrate may be a substrate including an insulation material. The substrate may include glass; a polymer such as a polyester of poly(ethylene terephthalate) (PET), poly(ethylene naphthalate) (PEN), or the like, a polycarbonate, or a poly(meth)acrylate; a polysiloxane (e.g., PDMS); an inorganic material such as $Al_2O_3$, ZnO, or the like; or a combination thereof, but embodiments are not limited thereto. A thickness of the substrate may be appropriately selected taking into consideration a substrate material, but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the semiconductor nanoparticle.

A wire layer including a thin film transistor or the like may be formed on the substrate. The wire layer may further include a gate line, a sustain voltage line, a gate insulating film, a data line, a source electrode, a drain electrode, a semiconductor layer, a protective layer, or the like, or a combination thereof. The detailed structure of the wire layer may vary depending on one or more embodiments. The gate line and the sustain voltage line may be electrically separated from each other, and the data line is insulated and crossing the gate line and the sustain voltage line. The gate electrode, the source electrode, and the drain electrode may form a control terminal, an input terminal, and an output terminal of the thin film transistor, respectively. The drain electrode may be electrically connected to the pixel electrode that will be described later.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure where the transparent conductive material and the material having light blocking properties are stacked sequentially.

Between two adjacent pixel electrodes, a pixel define layer (PDL) may overlap with a terminal end of the pixel electrode to divide the pixel electrode into a pixel unit. The pixel define layer is an insulating layer which may electrically block the at least two pixel electrodes.

The pixel define layer may cover a portion of the upper surface of the pixel electrode, and the remaining region of the pixel electrode where it is not covered by the pixel define layer may provide an opening. An organic light emitting layer that will be described herein may be formed on the region defined by the opening.

The organic light emitting layer may define each pixel area by the aforementioned pixel electrode and the pixel define layer. In other words, one pixel area may be defined as an area where it is formed with one organic light emitting unit layer which is contacted with one pixel electrode divided by the pixel define layer. In the display device according to one or more embodiments, the organic light emitting layer may be defined as a first pixel area, a second pixel area, and a third pixel area, and each pixel area may be spaced apart from each other leaving a predetermined interval by the pixel define layer.

In one or more embodiments, the organic light emitting layer may emit a third light belonging to a visible light region or belonging to an ultraviolet (UV) region. Each of the first to the third pixel areas of the organic light emitting layer may emit a third light. In one or more embodiments, the third light may be a light having a higher energy in a visible light region, and for example, may be a blue light (and, optionally a green light). In one or more embodiments, all pixel areas of the organic light emitting layer are designed to emit the same light, and each pixel area of the organic light emitting layer may be formed of the same or similar materials, or may show the same or similar properties. Thus, a process of forming the organic light emitting layer may be simplified, and the display device may be readily applied for, e.g., made by, a large scale/large area process. However, the organic light emitting layer according to one or more embodiments is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., a hole injection layer, a hole transport layer, an electron transport layer, or the like, or a combination thereof) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include an (e.g., transparent) insulating material for ensuring electrical insulation with the common electrode.

In one or more embodiments, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate located between the liquid crystal layer and the light emitting layer. The light source may further include LED and if desired, a light guide plate.

Figure 7:
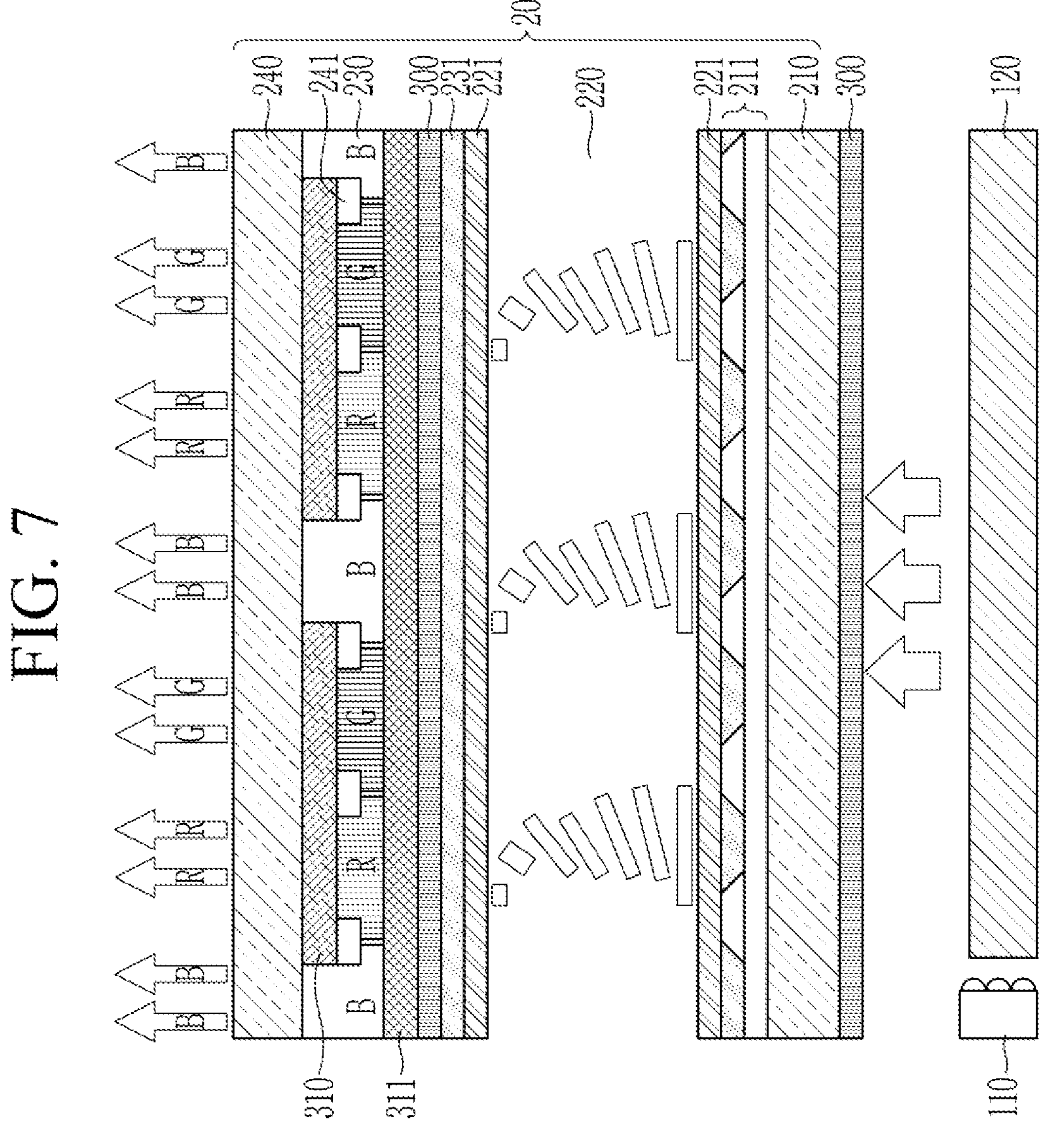
FIG. 7 is a schematic cross-sectional view of a display device (e.g., a liquid crystal display device) according to one or more embodiments.

In one or more embodiments, the display device (e.g., a liquid crystal display device) are illustrated with a reference to a drawing. FIG. 7 is a schematic cross-sectional view showing a liquid crystal display device according to one or more embodiments. Referring to FIG. 7, the display device of one or more embodiments includes a liquid crystal panel 200, a polarizing plate 300 disposed under the liquid crystal panel 200, and a backlight unit disposed under the polarizing plate 300.

The liquid crystal panel 200 may include a lower substrate 210, a stacked structure, and a liquid crystal layer 220 disposed between the stack structure and the lower substrate. The stack structure may include a transparent substrate 240, a first optical filter layer 310, a photoluminescent layer 230 including a pattern of a semiconductor nanoparticle polymer composite, and a second optical filter layer 311.

The lower substrate 210, also referred to as an array substrate, may be a transparent insulating material substrate. The substrate may be as described herein. A wire plate 211 may be provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but embodiments are not limited thereto. Details of such a wire plate are not particularly limited.

A liquid crystal layer 220 may be provided on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 may be provided under the lower substrate. Materials and structures of the polarizing plate 300 are not particularly limited. A backlight unit (e.g., emitting a blue light) may be disposed under the polarizing plate 300. An upper optical element or the polarizing plate 300 may be provided between the liquid crystal layer 220 and the transparent substrate 240, but embodiments are not limited thereto. For example, the upper polarizing plate may be disposed between the liquid crystal layer 220 and the photoluminescent layer 230. The polarizing plate may be any suitable polarizer that can be used in a liquid crystal display device. The polarizing plate may be triacetyl cellulose (TAC) having a thickness of less than or equal to about 200 μm, but embodiments are not limited thereto. In another embodiment, the upper optical element may be a coating that controls a refractive index without a polarization function.

The backlight unit includes a light source 110. The light source may emit a blue light or a white light. The light source may include, but is not limited to, a blue LED, a white LED, a white OLED, or a combination thereof.

The backlight unit may further include a light guide plate 120. In one or more embodiments, the backlight unit may be of an edge type. For example, the backlight unit may include a reflector (not shown), a light guide plate (not shown) provided on the reflector and providing a planar light source to the liquid crystal panel 200, and/or at least one optical sheet (not shown) on the light guide plate, for example, a diffusion plate, a prism sheet, or the like, but embodiments are not limited thereto. The backlight unit may not include a light guide plate. In one or more embodiments, the backlight unit may be a direct lighting. For example, the backlight unit may have a reflector (not shown) and a plurality of fluorescent lamps on the reflector at regular intervals, or may have an LED operating substrate on which a plurality of light emitting diodes, a diffusion plate thereon, and optionally at least one optical sheet may be disposed. Details (e.g., each component of a light emitting diode, a fluorescent lamp, a light guide plate, various optical sheets, and a reflector) of such a backlight unit are known and are not particularly limited.

A black matrix 241 may be provided under the transparent substrate 240 and has openings and hides a gate line, a data line, and a thin film transistor of the wire plate on the lower substrate. For example, the black matrix 241 may have a grid shape. The photoluminescent layer 230 may be provided in the opening of the black matrix 241 and may include a nanoparticle-polymer composite pattern including a first region R configured to emit a first light (e.g., a red light), a second region G configured to emit a second light (e.g., a green light), and a third region B configured to emit/transmit a third light, for example a blue light. If desired, the photoluminescent layer may further include at least one fourth region. The fourth region may include a quantum dot that emits light of a different color from the light emitted from the first to third regions (e.g., cyan, magenta, and yellow light).

In the photoluminescent layer 230, sections forming the pattern may be repeated corresponding to pixel areas formed on the lower substrate. A transparent common electrode 231 may be provided on the photoluminescent layer 230.

The third region B configured to emit/transmit a blue light may be a transparent color filter that does not change the emission spectrum of the light source. In this case, the blue light emitted from the backlight unit may enter in a polarized state and may be emitted through the polarizing plate and the liquid crystal layer as is. If needed, the third region may include a quantum dot emitting a blue light.

As described herein, if desired, the display device or light emitting device according to one or more embodiments may further include an excitation light blocking layer or a first optical filter layer (hereinafter, referred to as a first optical filter layer). The first optical filter layer may be disposed between the bottom surface of the first region R and the second region G and the substrate (e.g., the upper substrate 240), or on the upper surface of the substrate. The first optical filter layer may be a sheet having an opening in a portion corresponding to a pixel area (third region) displaying blue, and thus may be formed in portions corresponding to the first and second regions. That is, the first optical filter layer may be integrally formed at positions other than the position overlapped with the third region as shown in FIGS. 1A, 1B, and 6, and/or 7, but embodiments are not limited thereto. Two or more first optical filter layers may be spaced apart from each other at positions overlapped with the first and second regions, and optionally, the third region. When the light source includes a green light emitting device, a green light blocking layer may be disposed on the third region.

The first optical filter layer may block light, for example, in a predetermined wavelength region in the visible light region and may transmit light in the other wavelength regions, and for example, it may block blue light (or green light) and may transmit light except the blue light (or green light). The first optical filter layer may transmit, for example, a green light, a red light, and/or a yellow light that is a mixed color thereof. The first optical filter layer may transmit a blue light and block a green light, and may be disposed on the blue light emitting pixel.

The first optical filter layer may substantially block excitation light and transmit light in a desired wavelength region. The transmittance of the first optical filter layer for the light in a desired wavelength range may be greater than or equal to about 70%, greater than or equal to about 80%, greater than or equal to about 90%, or about 100%.

The first optical filter layer configured to selectively transmit a red light may be disposed at a position overlapped with the red light emitting section, and the first optical filter layer configured to selectively transmit a green light may be disposed at a position overlapped with the green light emitting section. The first optical filter layer may include a first filter region that blocks (e.g., absorbs) a blue light and a red light and selectively transmits the light of a predetermined range (e.g., greater than or equal to about 500 nm, greater than or equal to about 510 nm, or greater than or equal to about 515 nm to less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second filter region that blocks (e.g., absorbs) a blue light and a green light and selectively transmits light of a predetermined range (e.g., greater than or equal to about 600 nm, greater than or equal to about 610 nm, or greater than or equal to about 615 nm to less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or the first filter region and the second filter region. In one or more embodiments, the light source may emit a blue and a green mixed light, and the first optical filter layer may further include a third filter region that selectively transmits a blue light and blocks a green light.

The first filter region may be disposed at a position overlapped with the green light emitting section. The second filter region may be disposed at a position overlapped with the red light emitting section. The third filter region may be disposed at a position overlapped with the blue light emitting section.

The first filter region, the second filter region, and, optionally, the third filter region may be optically isolated. Such a first optical filter layer may contribute to improvement of color purity of the display device.

The display device may further include a second optical filter layer (e.g., a recycling layer of red/green light or yellow light) that is disposed between the photoluminescent layer and the liquid crystal layer (e.g., between the photoluminescent layer and the upper polarizer), transmits at least a portion of the third light (excitation light), and reflects at least a portion of the first light and/or the second light. One of the first light and the second light may be a red light and the other may be a green light, and the third light may be a blue light. The second optical filter layer may transmit only the third light (B) in a blue light wavelength region of less than or equal to about 500 nm, and light in a wavelength region of greater than about 500 nm, which is green light (G), yellow light, red light (R), or the like, may be not passed through the second optical filter layer and reflected. The reflected green light and red light may pass through the first and second regions and to be emitted to the outside of the display device.

The second optical filter layer or the first optical filter layer may be formed as an integrated layer having a relatively planar surface.

The first optical filter layer may include a polymer thin film including a dye and/or a pigment absorbing light in a wavelength that is to be blocked. The second optical filter layer or the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may include, for example, a porous silicon oxide, a porous organic material, a porous organic-inorganic composite, or the like, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

Figure 8:
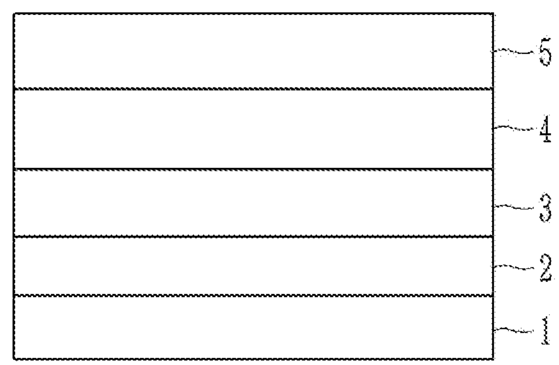
FIG. 8 is a schematic cross-sectional view of an electronic device (e.g., a light emitting device) according to one or more embodiments.

In one or more embodiments, the electronic device may include a light emitting device (e.g., an electroluminescent device) including the nanoparticles described above. FIG. 8 is a schematic cross-sectional view of a light emitting device (electroluminescent device) according to one or more embodiments. Referring to FIG. 8, the light emitting device includes an anode 1 and a cathode facing each other; a quantum dot light emitting layer 3 disposed between the anode and the cathode and including a plurality of quantum dots; and a hole auxiliary layer 2 located between the anode and the quantum dot light emitting layer. The hole auxiliary layer may include a hole injecting layer (HIL), a hole transporting layer (HTL), an electron blocking layer (EBL), or a combination thereof. The hole auxiliary layer may include any suitable organic/inorganic material having hole characteristics. The quantum dot light emitting device may further include an electron auxiliary layer 4 located between the cathode and the quantum dot light emitting layer. The electron auxiliary layer may include an electron injecting layer (EIL), an electron transporting layer (ETL), a hole blocking layer (HBL), or a combination thereof. The electron auxiliary layer may include any organic/inorganic material having electronic properties.

Hereinafter, the exemplary embodiments are illustrated in further detail with reference to examples. However, embodiments of the present disclosure are not limited to the examples.

EXAMPLES

Analysis Methods

[1] Photoluminescence Analysis

A photoluminescence (PL) spectrum of the nanoparticles produced and a composite including the same at an excitation wavelength of 450 nm was obtained using a Hitachi F-7000 spectrophotometer.

[2] ICP Analysis

Inductively coupled plasma atomic emission spectroscopy (ICP-AES) was performed using a Shimadzu ICPS-8100.

[3] Blue Light Absorbance and Light Conversion Efficiency (CE) for Composite

An amount of incident light of a wavelength of 450 nm (B) was measured by using an integrating hemisphere of an absolute quantum efficiency-measuring device (e.g., QE-2100, Otsuka Electronics Co., Ltd.).

Subsequently, a QD polymer composite was placed in the integrating hemisphere, and then, the incident light was irradiated to measure an amount of first light from the composite (A), and an amount of the incident light passing the composite (B') were measured, respectively.

Using the measured amounts, an incident light absorbance and the light conversion efficiency were calculated according to Equations 3 and 4:

$$\text{incident light absorbance (\%)}=[(B-B')/B]\times 100\% \quad \text{Equation 3}$$

$$\text{light conversion efficiency (\%)}=[A/(B-B')]\times 100\% \quad \text{Equation 4}$$

wherein, in Equations 3 and 4,

A is an amount of a first light emitted from the first composite,

B is an amount of incident light provided to the first composite, and

B' is an amount of incident light passing through the first composite.

[4] Transmission Electron Microscope (TEM) Analysis and TEM-EELS (Electron Energy Loss Spectroscopy) Analysis Transmission electron microscope analysis and EELS analysis of the produced nanoparticles were performed using a UT F30 Tecnai electron microscope.

Reference Example 1: Preparation of a First Semiconductor Nanocrystal

Silver acetate was dissolved in oleylamine, preparing a 0.06 molar (M) silver precursor containing solution (hereinafter, abbreviated as "silver precursor"). Sulfur was dissolved in oleylamine, preparing a 1 M sulfur precursor containing solution (hereinafter, abbreviated as "sulfur precursor"). Indium chloride was dissolved in ethanol, preparing a 1 M indium precursor containing solution (hereinafter, abbreviated as an indium precursor).

Gallium acetylacetonate, octadecene (ODE), and dodecanethiol were placed in a 100 milliliter (mL) reaction flask and heated at 120° C. for 10 minutes under vacuum. After cooling the flask to room temperature and replacing a gas inside the flask with nitrogen, the silver precursor, the sulfur precursor, and the indium precursor were added to the flask. The, the flask was heated at a reaction temperature of 210° C., and a reaction proceeded for 60 minutes. After decreasing the temperature of the flask to 180° C., trioctylphosphine (TOP) was added thereto, hexane and ethanol were added to the obtained mixture to promote precipitation, from which first semiconductor nanocrystals were separated via centrifugation and dispersed again in toluene.

A mole ratio among the indium precursor, the gallium precursor, and the sulfur precursor as used was 1:2.3:4.8. The amount of the silver precursor is controlled so as to obtain the composition of the semiconductor nanoparticle as shown in Table 1.

Reference Example 2: Preparation of an Indium Phosphide-Containing Semiconductor Nanoparticle Indium acetate, zinc acetate, and lauric acid were dissolved in 1-octadecene in a 200 mL reaction flask, and then heated at 120° C. under vacuum. A mole ratio among indium, zinc, and lauric acid was 1:1:3. After 1 hour, an atmosphere of the reaction flask was changed into nitrogen. The reaction flask was then heated to a temperature of 250° C., and a mixed solution of tris(trimethylsilyl)phosphine ($TMS_3P$) and trioctylphosphine was rapidly injected into the reaction flask, and the reaction was allowed to continue for about 20 minutes. Then, the reaction solution was rapidly cooled to room temperature and acetone was added thereto to facilitate formation of a precipitate. The precipitate was separated with a centrifuge, and the isolated precipitate (i.e., the InZnP core) was dispersed in toluene. The amount of the $TMS_3P$ was 0.75 moles per one mole of indium. The size of the InZnP core was about 2 nm.

Selenium was dispersed in trioctylphosphine to prepare a 0.4 M Se/TOP stock solution, and sulfur was dispersed in trioctylphosphine to prepare a 2 M S/TOP stock solution.

Zinc acetate and oleic acid were dissolved in trioctylamine in a 200 mL reaction flask, and the solution was vacuum-treated at 120° C. for 10 minutes. The reaction flask was filled with nitrogen ($N_2$), and heated to 320° C. The, the toluene dispersion of the InZnP semiconductor nanocrystal core prepared above was added to the reaction flask, and then the Se/TOP stock solution was injected several times into the reaction flask. A reaction proceeded to provide a particle including the InZnP core and a ZnSe shell disposed on the core. A total reaction time was about 100 minutes. In the preparation, a total amount of the Se was 20 moles per one mole of indium.

Then, at the reaction temperature, the S/TOP stock solution was injected into the reaction mixture over a reaction time to conduct a reaction to obtain a reaction solution that included a core shell quantum dot having a ZnS shell on the ZnSe shell. A total reaction time was 40 minutes, and a total amount of the sulfur that was used was about 12 moles per 1 mole of indium.

To the reaction mixture including the InP/ZnSe/ZnS quantum dots, an excess amount of ethanol was added to facilitate the precipitation. The quantum dots were then separated with a centrifuge. After the centrifugation, the supernatant was discarded and the precipitate was dried and then dispersed in toluene to obtain a quantum dot solution.

Example 1

Gallium chloride was dissolved in toluene to prepare a 4.5 M gallium precursor containing solution (hereinafter, abbreviated as a "gallium precursor").

Dimethylthiourea (DMTU), oleyl amine, and dodecanethiol were placed in a reaction flask, and then vacuum-treated at 120° C. for 10 minutes. After substituting a gas in the reaction flask with $N_2$ and heating it at 240° C. (a first temperature), the first semiconductor nanocrystal obtained as Reference Example 1 (having a maximum emission wavelength of about 524 nm and a full width at half maximum of about 44 nm) and the gallium precursor were added thereto. Then, the reaction flask was heated to 320° C. (a second temperature) to perform a reaction for about 10 minutes (a first reaction time). The reaction solution was then cooled to 180° C., and trioctylphosphine was added thereto. The reaction solution was then cooled to room temperature. Hexane and ethanol were added thereto to facilitate precipitation of a semiconductor nanoparticle, which was recovered via centrifugation and redispersed in toluene.

A mole ratio of the gallium precursor to the sulfur precursor as used was 1.1:1. A charge balance value of the obtained semiconductor nanoparticle is shown in Table 1.

Figure 9A:
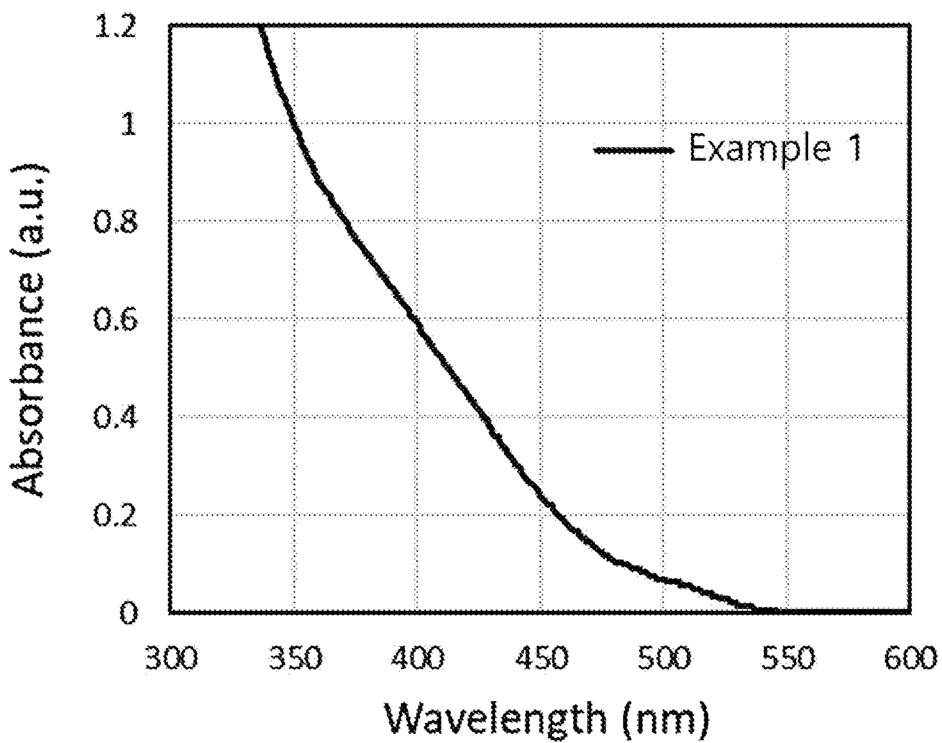
FIG. 9A is a graph of absorbance (arbitrary units, a.u.) versus wavelength (nm) and shows an ultraviolet-visible (UV-Vis) absorption spectrum of the semiconductor nanoparticle prepared in Example 1.

An ICP-AES analysis was performed with respect to the obtained semiconductor nanoparticle, and the results are shown in Table 1. A photoluminescence spectroscopy analysis and an UV-Vis absorption spectroscopy were performed with respect to the obtained semiconductor nanoparticle, and the results are shown in Table 2 and FIGS. 9A and 9B.

A full width at half maximum of the semiconductor nanoparticle was about 28 nm.

Figure 9B:
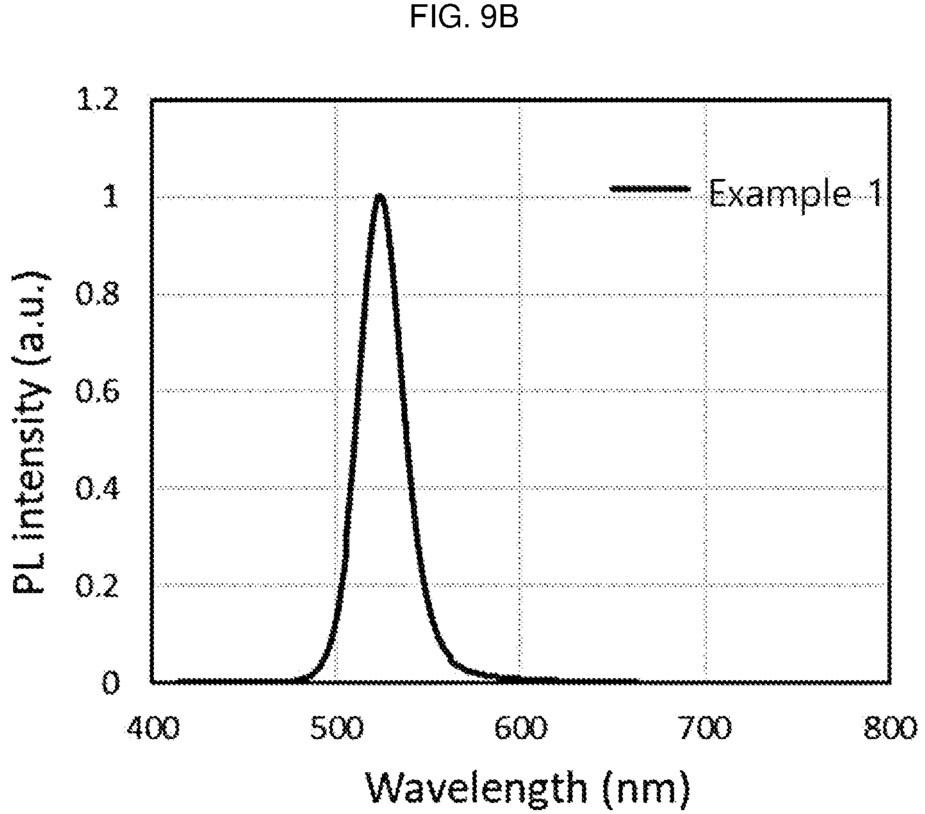
FIG. 9B is a graph of photoluminescence (PL) intensity (a.u.) versus wavelength (nm) and shows a photoluminescent spectrum of the semiconductor nanoparticle prepared in Example 1.

From the results of FIG. 9B, the semiconductor nanoparticle of Example 1 exhibited a percentage of the band-edge emission that is greater than or equal to about 99%. From the results of FIG. 9B, the semiconductor nanoparticle of Example 1 exhibited a relative band-edge emission intensity defined according to Equation 2 of greater than or equal to about 100 (e.g., about 210):

$$\text{relative band-edge emission intensity}=A1/A2 \qquad \text{Equation 2}$$

wherein, A1 is an intensity of the spectrum at a maximum emission wavelength, and A2 is a maximum intensity of the spectrum in a range of the maximum emission wavelength+greater than or equal to about 80 nm, e.g., about 100 nm.

Example 2

The semiconductor nanoparticle was prepared in a similar manner as Example 1, except that the second temperature was 300° C. and the first reaction time was 15 minutes.

An ICP-AES analysis was performed with respect to the obtained semiconductor nanoparticle, and the results are shown in Table 1. A photoluminescence spectroscopy analysis and an UV-Vis absorption spectroscopy were performed with respect to the obtained semiconductor nanoparticle, and the results are shown in Table 2. A full width at half maximum of the semiconductor nanoparticle was about 30 nm.

Example 3

The semiconductor nanoparticle was prepared in a similar manner as Example 1, except that the second temperature was 280° C. and the first reaction time was 50 minutes.

An ICP-AES analysis was performed with respect to the obtained semiconductor nanoparticle, and the results are shown in Table 1. A photoluminescence spectroscopy analysis and an UV-Vis absorption spectroscopy were performed with respect to the obtained semiconductor nanoparticle, and the results are shown in Table 2. A full width at half maximum of the semiconductor nanoparticle was about 30 nm.

Comparative Example 1

The semiconductor nanoparticle was prepared in a similar manner as Example 1, except that the second temperature was 320° C. and the first reaction time was 30 minutes.

An ICP-AES analysis was performed with respect to the obtained semiconductor nanoparticle, and the results are shown in Table 1. A photoluminescence spectroscopy analysis and an UV-Vis absorption spectroscopy were performed with respect to the obtained semiconductor nanoparticle, and the results are shown in Table 2.

Example 4

A first semiconductor nanocrystal was prepared in a similar manner as Reference Example 1, except that the amounts of the silver precursor and the indium precursor were changed to obtain a first semiconductor nanocrystal exhibiting a maximum emission wavelength of 517 nm and a full width at half maximum of 50 nm.

The semiconductor nanoparticle was prepared in a similar manner as Example 1, except for using the first semiconductor nanocrystal prepared above instead of the first semiconductor nanocrystal of Reference Example 1.

An ICP-AES analysis was performed with respect to the obtained semiconductor nanoparticle, and the results are shown in Table 1. A photoluminescence spectroscopy analysis and an UV-Vis absorption spectroscopy were performed with respect to the obtained semiconductor nanoparticle, and the results are shown in Table 2.

Comparative Example 2

The semiconductor nanoparticle was prepared in a similar manner as Example 4, except that a mixture of gallium chloride and gallium acetylacetonate (mixing ratio=1:1) were used as a gallium precursor, the second temperature was 200° C., and the first reaction time was 80 minutes.

An ICP-AES analysis was performed with respect to the obtained semiconductor nanoparticle, and the results are shown in Table 1. A photoluminescence spectroscopy analysis and an UV-Vis absorption spectroscopy were performed with respect to the obtained semiconductor nanoparticle, and the results are shown in Table 2.

TABLE 1

| | ICP mole ratio | | | | | | | |
|---|---|---|---|---|---|---|---|---|
| | Ag:S | In:S | Ga:S | Ga:(In + Ga) | (In + Ga)/Ag | (In + Ga):S | S:(AIG)[1] | CBV[2] |
| Example 1 | 0.33:1 | 0.09:1 | 0.64:1 | 0.88:1 | 2.2:1 | 0.73:1 | 0.95:1 | 1.26 |
| Example 2 | 0.32:1 | 0.10:1 | 0.58:1 | 0.85:1 | 2.1:1 | 0.68:1 | 0.99:1 | 1.18 |
| Example 3 | 0.38:1 | 0.11:1 | 0.62:1 | 0.85:1 | 1.9:1 | 0.73:1 | 0.90:1 | 1.28 |
| Example 4 | 0.31:1 | 0.11:1 | 0.55:1 | 0.84:1 | 2.1:1 | 0.66:1 | 1.03:1 | 1.15 |
| Comp. Ex 1 | 0.32:1 | 0.10:1 | 1.06:1 | 0.92:1 | 3.7:1 | 1.16:1 | 0.68:1 | 1.90 |
| Comp. Ex 2 | 0.025:1 | 0.021:1 | 1.03:1 | 0.98:1 | 42.3:1 | 1.051:1 | 0.93:1 | 1.59 |

Note
[1]S:AIG = mole ratio of sulfur to a sum of silver, indium, and gallium.
Note
[2]CBV = charge balance value according to Equation 1.

The results of Table 1 confirmed that the semiconductor nanoparticles of Comparative Examples 1 and 2 had a charge balance value of greater than about 1.5 and the semiconductor nanoparticles of the Examples 1 to 4 have a charge balance value of less than about 1.5.

TABLE 2

| | Maximum emission wavelength (nm) | Quantum yield (QY) |
|---|---|---|
| Example 1 | 524 | 70.9% |
| Example 2 | 523 | 79.0% |
| Example 3 | 530 | 82.7% |
| Example 4 | 520 | 57.6% |
| Comp. Ex 1 | 528 | 2.3% |
| Comp. Ex 2 | 524 | 6.1% |

The results of Table 2 confirmed that the semiconductor nanoparticles of the Examples 1 to 4 exhibited an improved luminous property in comparison with the semiconductor nanoparticles of the Comparative Examples 1 and 2.

Experimental Example 1

A toluene solution of the semiconductor nanoparticle prepared in each of Example 3 and Reference Example 2 was mixed with a binder (a quaternary copolymer of methacrylic acid, benzyl methacrylate, hydroxyethylmethacrylate, and styrene, an acid value: 130 mg KOH/g, a molecular weight: 8000 g/mol) solution (in PGMEA, at a concentration 30 wt %), to obtain a semiconductor nanoparticle-binder dispersion.

To each of semiconductor nanoparticle-binder dispersion, hexaacrylate with the following structure as a photopolymerizable monomer, ethylene glycol bis(3-mercaptopropionate) (hereinafter, 2T), an oxime-ester compound as an initiator, $TiO_2$ as a light diffusing agent, and PGMEA were added and mixed together to provide a composition.

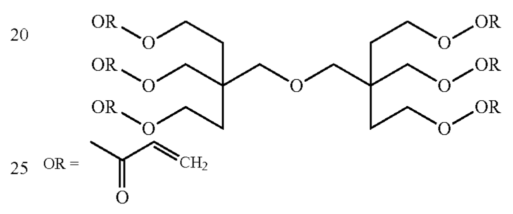

The compositions thus prepared included 20 wt % of semiconductor nanoparticles based on a total solid weight thereof.

Each of the compositions was respectively spin-coated on a glass substrate at 150 revolutions per minute (rpm) for 5 seconds to obtain a film. The film thus obtained was pre-baked (PRB) at 100° C. The pre-baked film was irradiated with light (a wavelength: 365 nm, intensity: 100 mJ) for 1 second under a mask with a predetermined pattern (e.g., square dot or stripe pattern) and then, developed in a potassium hydroxide aqueous solution to obtain a nanoparticle-polymer composite patterned film (a thickness: about 10 μm). The patterned film was thermally treated at 180° C. for 30 minutes under a nitrogen atmosphere.

For each of the patterned films, a blue light absorbance was measured, and the results are shown in Table 3.

TABLE 3

| | Blue light absorbance |
|---|---|
| Ex. 3 | 97% |
| Ref. Ex. 2 | 75% |

The results of Table 3 confirmed that the semiconductor nanoparticle of Example 3 exhibited significantly improved blue light absorbance in comparison with the semiconductor nanoparticle of Reference Example 2.

While this disclosure has been described in connection with what is presently considered to be practical embodiments, it is to be understood that the present subject matter is not limited to the disclosed exemplary embodiments. On the contrary, it is intended to cover various modifications and equivalent arrangements included within the spirit and scope of the appended claims.

What is claimed is:

1. A semiconductor nanoparticle, comprising:

silver, indium, gallium, and a chalcogen element, wherein the chalcogen element comprises sulfur, wherein the semiconductor nanoparticle emits a first light having a full width at half maximum of greater than or equal to about 5 nanometers to less than or equal to about 70 nanometers, and a maximum emission wavelength of greater than or equal to about 500 nanometers to less than or equal to about 600 nanometers, wherein the semiconductor nanoparticle has a quantum yield of greater than or equal to about 50%, and wherein in the semiconductor nanoparticle, a mole ratio of gallium to sulfur is greater than or equal to about 0.1:10.3:1 to less than or equal to about 1:1, and a mole ratio of indium to sulfur is less than or equal to 0.13:1, wherein the semiconductor nanoparticle has a charge balance value as defined by Equation 1A that is greater than or equal to about 0.8 to less than or equal to about 1.5:

$$\text{charge balance value}=\{[Ag]+3([In]+[Ga])\}/2[S] \quad \text{Equation 1A}$$

wherein, in Equation 1A,

[Ag], [In], [Ga], and [S] are molar amounts of the silver, indium, gallium, and sulfur in the semiconductor nanoparticle, respectively.

2. The semiconductor nanoparticle of claim 1, wherein the mole ratio of gallium to sulfur is greater than or equal to about 0.3:1 and less than or equal to about 0.64:1, and a mole ratio of indium to sulfur is greater than 0.01:1 to less than or equal to 0.11:1.

3. The semiconductor nanoparticle of claim 1, wherein the maximum emission wavelength of greater than or equal to about 505 nanometers to less than or equal to about 580 nanometers.

4. The semiconductor nanoparticle of claim 1, wherein the semiconductor nanoparticle has a quantum yield of greater than or equal to about 60% to less than or equal to about 100%.

5. The semiconductor nanoparticle of claim 1, wherein the full width at half maximum is greater than or equal to about 10 nanometers to less than or equal to about 45 nanometers.

6. The semiconductor nanoparticle of claim 1, wherein at least about 97% of emission of the semiconductor nanoparticle is band-edge emission.

7. The semiconductor nanoparticle of claim 1, wherein in a photoluminescence spectrum of the semiconductor nanoparticle, a relative band-edge emission intensity defined by Equation 2 is greater than about 20:

$$\text{relative band-edge emission intensity}=A1/A2 \quad \text{Equation 2}$$

wherein, in Equation 2,

A1 is an intensity at a maximum emission wavelength, and

A2 is a maximum intensity in a wavelength range of the maximum emission wavelength+greater than or equal to about 80 nanometers.

8. The semiconductor nanoparticle of claim 1, wherein in the semiconductor nanoparticle, a mole ratio of sulfur to a sum of silver, indium, and gallium [S:(Ag+In+Ga)] is greater than or equal to about 0.65:1 to less than or equal to about 1.35:1.

9. The semiconductor nanoparticle of claim 1, wherein in the semiconductor nanoparticle, a mole ratio of a sum of indium and gallium to silver [(In+Ga):Ag] is greater than or equal to about 1.8:1 to less than or equal to about 3.5:1, or a mole ratio of gallium to sulfur (Ga:S) is greater than or equal to about 0.3:1 to less than or equal to about 0.64:1.

10. The semiconductor nanoparticle of claim 1, wherein in the semiconductor nanoparticle, the charge balance value is greater than or equal to about 1.02 to less than or equal to about 1.28.

11. The semiconductor nanoparticle of claim 1, wherein the semiconductor nanoparticle does not comprise lithium.

12. The semiconductor nanoparticle of claim 1, wherein the semiconductor nanoparticle further comprises an inorganic layer comprising a zinc chalcogenide.

13. A method for producing the semiconductor nanoparticle of claim 1, the method comprising:

preparing a reaction medium comprising a first precursor, an organic ligand, and an organic solvent;

heating the reaction medium to a first temperature;

adding a second precursor and a first semiconductor nanocrystal comprising silver, indium, gallium, and sulfur to the heated reaction medium, wherein one of the first precursor and the second precursor is a gallium precursor and the other is a sulfur precursor; and heating the reaction medium to a second temperature and reacting for a first reaction time to form the semiconductor nanoparticle, wherein the first temperature is greater than or equal to about 120° C. to less than or equal to about 280° C., and the second temperature is greater than or equal to about 190° C. to less than or equal to about 380° C., and wherein the first reaction time is controlled to obtain the charge balance value of greater than or equal to 0.8 to less than or equal to 1.5.

14. The method of claim 13, wherein the gallium precursor comprises a gallium halide and optionally a gallium acetylacetonate, the organic solvent comprises an aliphatic amine, and the organic ligand comprises a thiol compound.

15. The method of claim 1, wherein the second temperature is greater than or equal to about 290° C. to less than or equal to about 330° C., and the first reaction time is greater than or equal to about 10 minutes to less than about 50 minutes, or the second temperature is less than about 290° C. and the first reaction time is greater than or equal to about 30 minutes.

16. A composite, comprising:

a matrix; and the semiconductor nanoparticle of claim 1, wherein the semiconductor nanoparticle is dispersed in the matrix.

17. The composite of claim 16, wherein the composite has a blue light absorbance of from about 78% to about 98%.

18. A device, comprising:

a color conversion layer comprising a color conversion region and optionally a partition wall defining each color conversion region of the color conversion layer, wherein the color conversion region comprises a first region corresponding to a first pixel, and wherein the first region comprises the composite of claim 16.

19. A display device, comprising:

a light source; and the composite of claim 16, wherein the light source is configured to provide a color conversion panel with an incident light.

20. The display device of claim 19, wherein the light source comprises an organic light emitting diode, a micro LED, a mini LED, an LED comprising a nanorod, or a combination thereof.

* * * * *